United States Patent
Kern et al.

(10) Patent No.: US 9,520,161 B2
(45) Date of Patent: Dec. 13, 2016

(54) METHODS FOR CALCULATING AND DETERMINING REFERENCE VALUES FOR SEMICONDUCTOR MEMORY CELLS

(71) Applicant: Infineon Technologies AG, Neubiberg (DE)

(72) Inventors: Thomas Kern, Aschheim (DE); Michael Goessel, Mahlow (DE); Karl Hofmann, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/834,897

(22) Filed: Aug. 25, 2015

(65) Prior Publication Data

US 2016/0093347 A1 Mar. 31, 2016

(30) Foreign Application Priority Data

Sep. 30, 2014 (DE) ......................... 10 2014 114 251

(51) Int. Cl.
*G11C 5/06* (2006.01)
*G11C 11/56* (2006.01)
*G11C 7/22* (2006.01)
*G11C 7/14* (2006.01)
*G11C 16/28* (2006.01)

(52) U.S. Cl.
CPC . *G11C 5/06* (2013.01); *G11C 7/14* (2013.01); *G11C 7/22* (2013.01); *G11C 11/5642* (2013.01); *G11C 16/28* (2013.01)

(58) Field of Classification Search
CPC ............... G11C 5/06; G11C 8/12; G11C 7/22; G11C 16/28
See application file for complete search history.

(56) References Cited

U.S. PATENT DOCUMENTS

| | | | |
|---|---|---|---|
| 8,243,513 B2 * | 8/2012 | Sarin ................... | G11C 11/5628 365/185.03 |
| 2003/0206446 A1 * | 11/2003 | Yamada ............. | G11C 16/3459 365/185.24 |
| 2009/0168578 A1 | 7/2009 | Scade et al. | |
| 2012/0026799 A1 | 2/2012 | Lee | |
| 2014/0192581 A1 | 7/2014 | Achter et al. | |

* cited by examiner

*Primary Examiner* — J. H. Hur
*Assistant Examiner* — Ajay Ojha
(74) *Attorney, Agent, or Firm* — Eschweiler & Associates, LLC

(57) ABSTRACT

A method and associated apparatus to determine a reference value on the basis of a plurality of half reference values stored in memory cells is disclosed, wherein the plurality of half reference values are read from the memory cells, wherein a subset of half reference values is determined from the plurality of half reference values, and wherein the reference value is determined on the basis of the subset of half reference values.

20 Claims, 17 Drawing Sheets

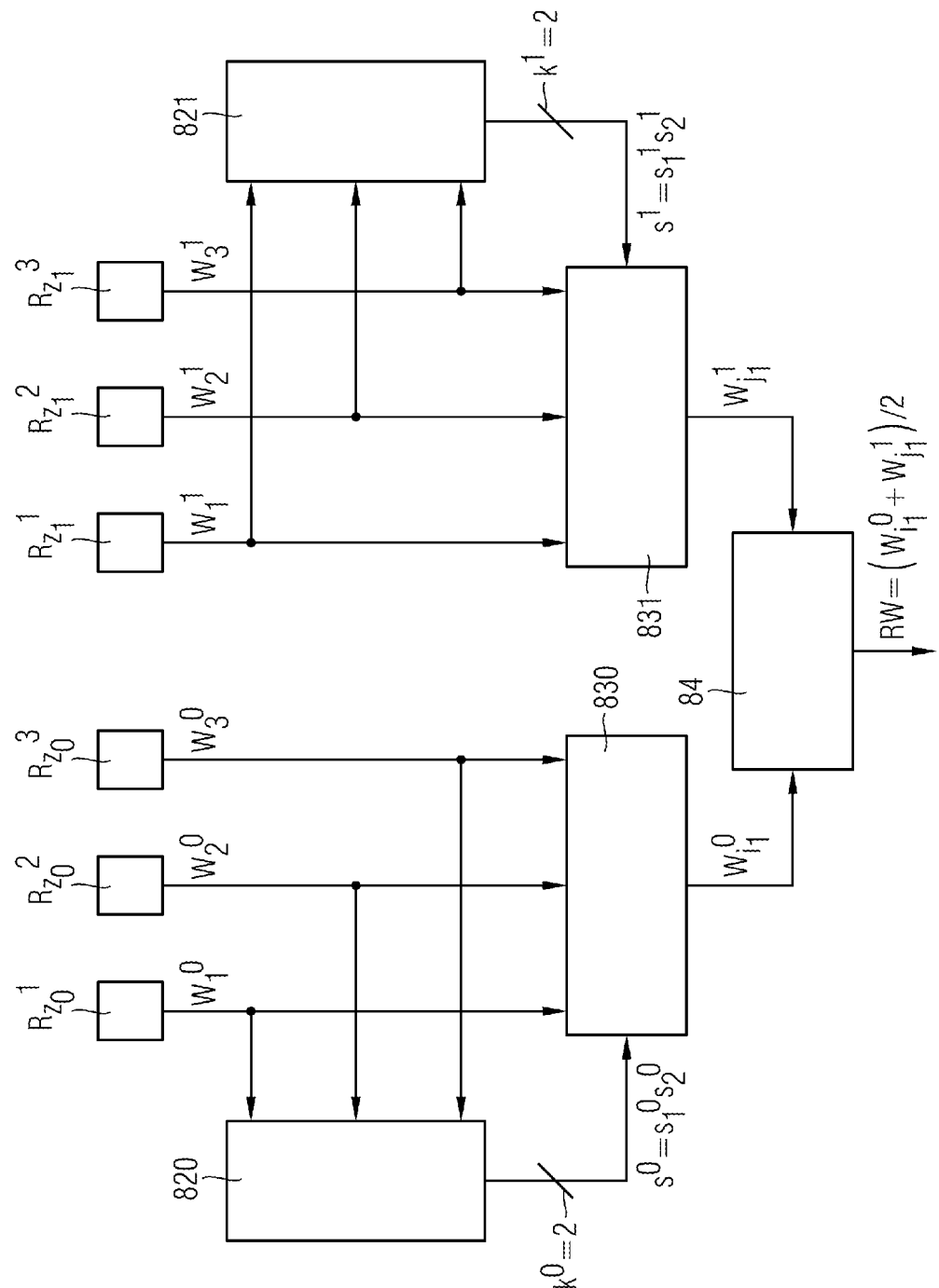

METHODS FOR CALCULATING AND DETERMINING REFERENCE VALUES FOR SEMICONDUCTOR MEMORY CELLS

CROSS REFERENCE TO RELATED APPLICATIONS

This application claims priority to German Application number 102014114251.9, filed on Sep. 30, 2014, the contents of which are herein incorporated by reference in its entirety.

FIELD

The disclosure relates in particular to reference values which are used to determine with the aid of at least one comparison, for example, what value a memory cell of a memory element has.

SUMMARY

The disclosure is directed to an efficient approach for determining a memory content of at least one memory cell by means of at least one reference value.

In one embodiment a method for determining a reference value on the basis of a plurality of half reference values stored in memory cells is provided, wherein the plurality of half reference values are read from the memory cells, wherein a subset of half reference values is determined from the plurality of half reference values, wherein the subset comprises fewer than all of the half reference values, and wherein the reference value is determined on the basis of the subset of half reference values The memory cell can be a memory cell of a RAM. The memory cells can be embodied as reference memory cells, e.g. as part of a RAM which is not used to store other information (e.g. useful data).

The examples described here can be applied to different memory elements, in particular to devices which have persistent and reprogrammable memory properties, e.g. NAND/NOR flash memories, RRAM, MRAM, FeRAM. The approach can also be used for hard disk memories, multilevel, multibit or other memories.

A half reference value is, in one embodiment, a physical value which is obtained upon reading the memory cell. The memory cell was programmed e.g. beforehand with that digital value for which a physical representative in the form of the half reference value is obtained when the memory cell is read as mentioned here.

With the approach presented here, e.g. disadvantages of known methods and circuit arrangements for generating reference values can be avoided or reduced in order, for example, to determine reference values efficiently in such a way that defective or inexpedient memory cells that serve for forming the reference values have no or only a slight effect. In this case, the reference values can be formed using memory cells of identical type such as are also used for storing different digital values in the memory.

Not every determination of the reference value has to be preceded by a process of reading the (reference) memory cells anew. By way of example, a process of reading the memory cells can be carried out once or at predefined points in time. The results of such reading processes on a multiplicity of memory cells can be stored e.g. in a volatile manner (e.g. in an SRAM or in a register) or in a nonvolatile manner. One possibility is that such storage is already carried out in the event of a component test, a system start and/or an initialization in particular also depending on a change, in particular degradation, of the cell parameters.

In one embodiment, the subset of the half reference values is determined by at least one erroneous or inexpedient half reference value being excluded.

In order to obtain a reference value that is as meaningful as possible, by way of example, inexpedient or erroneous half reference values are excluded from the subset which is used for determining the reference value.

In another embodiment, the subset of the half reference values is determined by at least one half reference value being excluded which deviates from the other half reference values by at least one predefined value.

In one embodiment, the half reference values comprise a number of x groups of half reference values, wherein each memory cell can store x possible digital states, wherein each group comprises at least one half reference value, wherein the subset of half reference values is determined from the plurality of half reference values by a group subset of the half reference values of the respective group being determined for at least one group, and wherein the reference value is determined on the basis of the plurality of group subsets of the half reference values.

In one embodiment the value "x" is a digital value (greater than one) storable in the memory cell. By way of example, the memory cell can be embodied such that binary values (0 and 1) can be stored. Alternatively, the memory cell can also be embodied such that n-ary values (n>2) can be stored. Smaller reading windows should be expected in this case. In the case of small reading windows, it is advantageous if the reference value is determined on the basis of a plurality of groups of half reference values. In this case, preferably, each group is based on a plurality of memory cells which were programmed to one of the n-ary values and supply a physical value on the basis of this programming during reading.

In this case, it should be noted that the same or a different number of memory cells can be assigned to each group. By way of example, one group for the digital value "1" can be assigned ten cells which were programmed to 1 and accordingly supply ten (physical) half reference values (also designated as 1-reference values) during reading. Another group for the digital value "0" may be assigned only an individual cell or it is possible to use a fixed, e.g. previously stored, value as 0-reference value for determining the reference value. It is also possible for no half reference value at all to be determined or taken into account for at least one of the groups.

Moreover, in one embodiment, the group subset of the half reference values is determined by at least one half reference value being excluded which deviates from the other half reference values of the group by a predefined value.

In particular, a reduction of the cardinality of the set of the half reference values to the cardinality of the set of the subset of half reference values can be achieved by at least one comparison being carried out. By way of example, all or a portion of the half reference values of the subset can be compared with one half reference value or one predefined half reference value. Moreover, one option is for all or a portion of the half reference values of the subset to be compared with a plurality of other half reference values of the subset. It is thus possible to detect e.g. "outliers" of half reference values which have a value that lies outside a predefined range or deviates from at least one other half reference value by more than a predefined range.

What can thus advantageously be achieved is that half reference values are sorted out and half reference values sorted out in this way do not contribute to the determination of the reference value. Therefore, inexpedient corruptions of the reference value can be reduced or avoided, e.g. by incorrect half reference values not influencing the determination of the reference value. Such an incorrect half reference value can be e.g. a physical value which supplies the value 50 μA on account of a fault in the memory cell (e.g. a so-called stuck-at fault), even though it should correctly supply the value 10 μA±2 μA.

Furthermore, in one embodiment, x=2 holds true and each memory cell can store two digital states.

Binary memory cells which can assume e.g. either the digital value 0 or the digital value 1 can thus be involved.

In the context of an additional embodiment, the reference value is determined on the basis of at least one group subset by means of at least one of the following operations: an averaging of the half reference values of the group subset, a formation of the median of the half reference values of the group subset, or a weighted averaging of the half reference values of the group subset.

In a next embodiment, the reference value is determined in a manner additionally taking account of an external signal for correcting the half reference values of at least one group subset.

By way of example, the external signal can supply a value for the comparison with the half reference values. Moreover, the external signal can supply a value for the determination of the reference value itself, e.g. for the operation which serves for determining the reference value.

In one embodiment, at least one group subset of half reference values is determined by means of a group-specific control signal forming unit used to determine which of the half reference values of the group are intended to be taken into account for determining the reference value, and by means of a group-specific selection circuit used to select the group subset of the half reference values by means of a control signal provided by the control signal forming unit.

In a further embodiment, the reference value is determined by means of a reference value forming unit on the basis of at least one group subset of the half reference values.

The explanations concerning the method are correspondingly applicable to the other categories of claims.

In order to achieve the object mentioned above, a device is also proposed for determining a reference value on the basis of a plurality of half reference values stored in memory cells, comprising a processing unit designed in such a way that a subset of a plurality of half reference values read from the memory cells is determinable, wherein the subset comprises fewer than all of the half reference values, and the reference value is determinable on the basis of the subset of the half reference values.

The device can be embodied in one component or in distributed fashion in a plurality of components.

In a next embodiment, the processing unit comprises at least one selection component with the aid of which the subset of half reference values is determinable, wherein the selection component comprises: a control signal forming unit, with the aid of which a control signal is generatable on the basis of comparisons of the half reference values or of a portion of the half reference values; and a selection circuit, with the aid of which a group-related subset of the half reference values is selectable on the basis of the control signal of the control signal forming unit.

Moreover, in one embodiment, at least one selection component is provided for at least one group of half reference values, wherein each group of half reference values represents a multiplicity of half reference values which correspond to one of a plurality of digital states of the memory cell.

The group of half reference values thus corresponds for example to a digital state which was previously programmed into the memory cells (as reference cells). One example memory cell may assume the digital states 0 and 1: As 0-reference cells, a first group of memory cells is programmed with 0 and, as 1-reference cells, a second group of memory cells is programmed as 1. The 0-reference cells are read and the first group of physical half reference values results; the 1-reference cells are read and the second group of physical half reference values results. Therefore, the first group represents physical half reference values of the 0-reference cells (of the first digital state) and the second group represents physical half reference values of the 1-reference cells (of the second digital state).

The selection component can provide for example a mean value or median value of a group of half reference values. The selection component can select at least one half reference value from the group of half reference values. In this respect, the group-related subset can comprise at least one half reference value.

It is a property of the selection component, in particular, to reduce the number of half reference values provided on the input side in such a way that on the output side a smaller number of half reference values are made available for further processing.

Advantageously, such half reference values which fulfill or do not actually fulfill a predefined condition are sorted out in this case. This has the advantage that sorted out half reference values have no adverse effect (corruption) on the reference value to be determined. The described preselection of the half reference values thus increases the reliability and efficiency of the reference value.

In one embodiment, each memory cell can assume two digital states, and wherein in each case at least one selection component is provided for a group of half reference values per digital state of the memory cell.

In an additional embodiment, the processing unit comprises a reference value forming unit, which determines the reference value by means of the at least one selection component.

In another embodiment, the reference value forming unit is designed in such a way that the reference value is determinable by means of at least one of the following operations: an averaging of the half reference values which are provided by the at least one selection component, a formation of the median of the half reference values which are provided by the at least one selection component, or a weighted averaging of the half reference values which are provided by the at least one selection component.

Moreover, in one embodiment, the reference value forming unit is designed in such a way that the reference value is determinable in a manner additionally taking account of an external signal for correcting the half reference values.

Moreover, in a further embodiment, a plurality of selection components are provided per group of half reference values.

By way of example, the selection components, that is to say the combinations of control signal forming unit and selection circuit, can in each case be arranged successively (serially), such that the selection circuits progressively reduce the half reference values. Moreover, in one option, the selection components are arranged in parallel with one another, such that e.g. one half reference value is selected from in each case three incoming half reference values (e.g.

by means of formation of a median). In this regard, by means of three selection components arranged in parallel, nine half reference values can be reduced to three half reference values (e.g. the median value in each case). Combinations of selection components arranged in parallel and serially are also possible.

In this case, it should be noted that the components of the device, in particular the processing unit, can be realized in software, hardware and/or firmware. Combinations of the implementation variants mentioned above are also possible. In particular, the above device can be embodied as a circuit arrangement. Optionally, the device can be part of a memory or comprise a memory.

The processing unit mentioned here can be embodied in particular as a processor unit and/or an at least partly hardwired or logical circuit arrangement which is designed for example in such a way that the method as described herein can be carried out. The processing unit can be or comprise any type of processor or computer with correspondingly required peripherals (memory, input/output interfaces, input/output devices, etc.).

The solution presented here furthermore comprises a computer program product loadable directly into a memory of a digital computer, comprising program code parts suitable for carrying out steps of the method described here.

Furthermore, the problem mentioned above is solved by means of a computer-readable memory medium, e.g. an arbitrary memory, comprising instructions (e.g. in the form of program code) which are executable by a computer and are suitable for the computer to carry out steps of the method described here.

Moreover, the embodiments may be employed in conjunction with a system comprising at least one of the devices described here.

A circuit arrangement for determining a reference value RW of a memory cell Z that is writable or programmable with digital values is also proposed, wherein the reference value RW is determinable on the basis of (physical analog) half reference values $W_1^x, \ldots, W_{nx}^x$ which are obtained from nx memory cells $R_{z_x}^1$ to $R_{z_x}^{nx}$ written to with a first digital value x during reading, (physical analog) half reference values $W_1^y, \ldots, W_{ny}^y$ which are obtained from ny memory cells $R_{z_y}^1$ to $R_{z_y}^{ny}$ written to with a second digital value y, which is different from the first digital value x, during reading. In one embodiment the nx memory cells written to with the first digital value x form a first set of nx half reference cells or x-reference cells, the ny memory cells written to with the second digital value y form a second set of ny half reference cells or y-reference cells, nx≥1 and ny≥1 hold true, and a selection circuit, a control signal forming unit and a reference value forming unit are provided. In one embodiment, the selection circuit has: nx first inputs for inputting the half reference values $W_1^x, \ldots, W_{nx}^x$ output by the x-reference cells, wherein the first inputs are connected to the outputs of the corresponding x-reference cells, $k^x$ second inputs for inputting a digital control signal $s^x$ having the word width $k^x$ which is provided by the control signal forming unit, mx outputs for outputting mx selected half reference values $W_{i_1}^x, \ldots, W_{i_{mx}}^x$ on the basis of the nx input half reference values $W_1^x, \ldots, W_{nx}^x$, wherein the half reference values output at the mx outputs are selected from the input half reference values depending on the digitcal control signal $s^x$ present at the $k^x$ second inputs, and wherein mx<nx, mx≥1 and $k^x$≥1 hold true. In one embodiment the control signal forming unit for forming the digital control signal $s^x$ has: nx inputs for inputting the half reference values $W_1^x, \ldots, W_{nx}^x$ output by the x-reference cells, $k^x$ outputs for outputting the digital control signal $s^x$ having the word width $k^x$, wherein the nx outputs of the x-reference cells are connected to the corresponding nx inputs of the control signal forming unit, wherein the $k^x$ outputs of the control signal forming unit are connected to the second $k^x$ inputs of the selection circuit, wherein the control signal forming unit forms the control signal $s^x$ on the basis of at least one comparison of half reference values present at its inputs, and wherein the control signal forming unit and the selection circuit are conFig.d such that if, instead of a correct half reference value $W_j^x$ for j ∈ {1, . . . , nx}. In one embodiment an erroneous half reference value $W_j^{xf} \neq W_j^x$ is obtained from one x-reference cell $R_{z_x}^j$ and no further erroneous half reference value is output by another x-reference cell, the selection circuit, when the control signal $s^x$ formed by the control signal forming unit is present at its mx outputs, outputs such half reference values $W_{i_1}^x, \ldots, W_{i_{mx}}^x$ where $\{W_{i_1}^x, \ldots, W_{i_{mx}}^x\} \subset \{W_1^x, \ldots, W_{nx}^x\}$ which differ from the erroneous half reference value $W_j^{xf}$ present at its j-th input, wherein the reference value forming unit has mx first inputs and my second inputs and an output, wherein half reference values $W_{i_1}^x, \ldots, W_{i_{mx}}^x$ output by mx x-reference cells $R_{z_x}^{i_1}$ to $R_{z_x}^{i_{mx}}$ and output by the selection circuit are present at the mx first inputs, wherein half reference values $W_{j_1}^y, \ldots, W_{j_{my}}^y$ output by my y-reference cells $R_{z_y}^{j_1}$ to $R_{z_y}^{j_{my}}$ are present at the my second inputs of the reference value forming unit, and wherein the reference value forming unit is conFIG.d such that the reference value RW is formed from half reference values which are output by the x-reference cells and by the y-reference cells and which are present at the inputs of the reference value forming unit in such a way that, if no error is present, $$\frac{W_{i_1}^x, \ldots, W_{i_{mx}}^x}{mx} < RW < \frac{W_{j_1}^y, \ldots, W_{j_{my}}^y}{my}$$

holds true if $W_i^x < W_j^y$ for i ∈ {1, . . . , nx} and j ∈ {1, . . . , ny} and that $$\frac{W_{i_1}^x, \ldots, W_{i_{mx}}^x}{mx} > RW > \frac{W_{j_1}^y, \ldots, W_{j_{my}}^y}{my}$$

holds true if $W_i^x < W_j^y$ for i ∈ {1, . . . , nx} and j ∈ { 1, . . . , ny} and if my≥1, x, y ∈ {0, . . . , p−1} and p≥2 hold true.

The above-described properties, features and advantages of this disclosure and the way in which they are achieved will become clearer and more clearly understood in association with the following schematic description of example embodiments which are explained in greater detail in association with the drawings. In this case, identical or identically acting elements may be provided with identical reference signs for the sake of clarity.

BRIEF DESCRIPTION OF THE DRAWINGS

FIG. 8a shows a circuit arrangement for forming a reference value.

DETAILED DESCRIPTION

Figure 1:
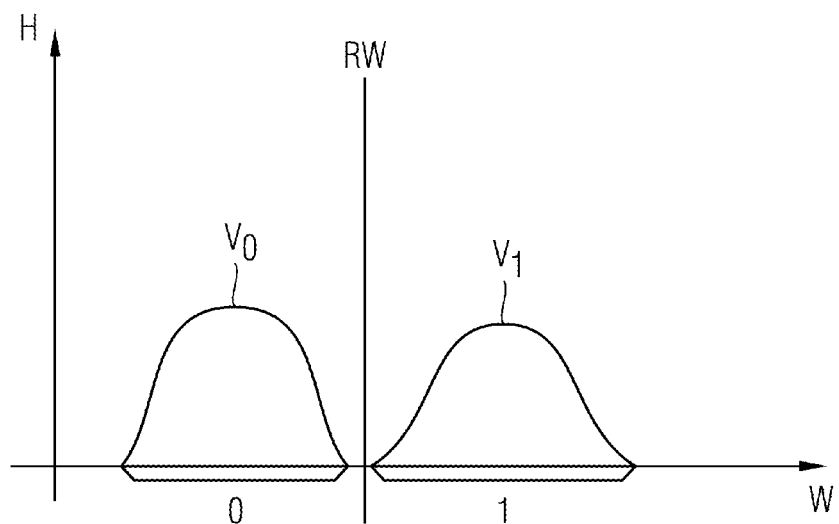
FIG. 1 shows a distribution of frequencies of physical values of memory cells in which a binary value 0 or 1 was stored.

Addressable memories (also designated as memories or memory elements) comprise memory cells which store digital information as physical variables. In this case, the memory cells can assume different physical values if different items of information are stored in them. The different physical values are also designated as states of the memory cell. If the information stored in a memory cell is binary, then a memory cell can assume two different physical values or two different states. The binary values to be stored are then usually designated by 0 and 1.

If an item of information to be stored in a memory cell is ternary, for example, then a memory cell can assume three different physical states corresponding to the ternary values 0, 1 and 2 to be stored.

Generally, an item of information to be stored in the memory cell can be n-ary by virtue of the fact that the memory cell can assume n different values or n different states (n≥2, wherein the values can be designated by 0, 1, 2, . . . , n−1).

By way of example, consideration is given hereinafter to the case, in particular, where the information to be stored is binary and the two binary values 0 and 1 are stored in a memory cell. In the error-free case, therefore, the memory cell can assume two different physical values which are distinguishable from one another and which correspond to the binary values 0 and 1.

This example of the two binary values per memory cell can correspondingly be applied to memory cells in which more than two states can be stored. In the error-free case, such a memory cell can then assume a plurality of different states which are distinguishable from one another.

It is possible, for example, for the different physical values to be different electrical resistances, wherein a higher resistance can correspond to the binary value 0 and a lower resistance can correspond to the binary value 1. It is correspondingly also possible for the lower resistance to represent the binary value 0 and the higher resistance to represent the binary value 1.

A memory cell can be, for example, a memory cell of an MRAM (magnetoresistive random access memory; RAM: random access memory). An MRAM has a layer having fixed, permanent magnetization and a layer having variable, programmable magnetization. If the directions of the magnetization of the layer having variable magnetization and the layer having fixed magnetization are identical or parallel, then the corresponding MRAM cell has a first electrical resistance. If the directions of the magnetization of the layer having variable magnetization and the layer having fixed magnetization are not identical or are antiparallel, then the corresponding MRAM cell has a second electrical resistance, which differs from the first electrical resistance.

Storing or writing information in a memory cell consists in defining the physical state of the memory cell such that it corresponds to the value to be stored.

For the example of an MRAM cell, the magnetization of the variable layer is to be determined in such a way that it corresponds to the information to be stored.

In the case of the binary MRAM cell, the direction of the magnetization of its variable layer is to be determined for example in such a way that it is parallel to the direction of the fixed layer if a binary 0 is stored in the cell, and that it is antiparallel if a 1 is stored in the cell. Storing or writing information in a memory cell is also referred to as programming the cell.

When reading out the information stored in the memory cell, it is possible to form an analog physical value $W_G$ of a physical variable G, which value is dependent on the state of the memory cell which was determined during the process of writing the information to the memory cell.

By way of example, if different electrical resistance values correspond to the different states, then when the information stored in the cell is read out, the cell can output a current intensity which is dependent on the present resistance, i.e. dependent on the state of the cell.

It is likewise possible, for example, for a voltage to be determined during the reading of a cell, the magnitude of said voltage being dependent on whether a binary value 1 or 0 was programmed into the cell beforehand.

Generally, a value of some other physical variable can also be determined during reading, which value is dependent on what digital value was programmed into the cell beforehand.

In particular, the analog values—determined during reading—of the physical variables from different memory cells which were programmed with 0 vary. The analog values—determined during reading—of the physical variables from different memory cells which were programmed with 1 or with some other value also vary.

FIG. 1 shows by way of example frequency distributions of values (e.g. voltages) which can be obtained during reading. By way of example, such frequency distributions can be obtained when reading a plurality of cells.

The ordinate indicates a frequency H of the occurrence of the values, and the abscissa indicates the respective (physical) value W. In FIG. 1 it is assumed by way of example that the physical values which correspond to the digital value 0 are less than the physical values which correspond to the digital value 1. A frequency distribution $V_0$ corresponds to a distribution of the physical values for the digital value 0 and a frequency distribution $V_1$ corresponds to a distribution of the physical values for the digital value 1. The frequency distributions $V_0$ and $V_1$ do not overlap in the example in accordance with FIG. 1; a reference value RW is depicted between the two distributions $V_0$ and $V_1$.

If the analog value W obtained from a cell during reading is less than the reference value RW, then it can be determined that the digital value 0 was stored in the cell. If, correspondingly, the analog value obtained from a cell during reading is greater than the reference value RW, then it can be determined that the digital value 1 was stored in the cell.

In the case of an MRAM, the physical value W obtained during reading can be a current intensity, for example.

Figure 2:
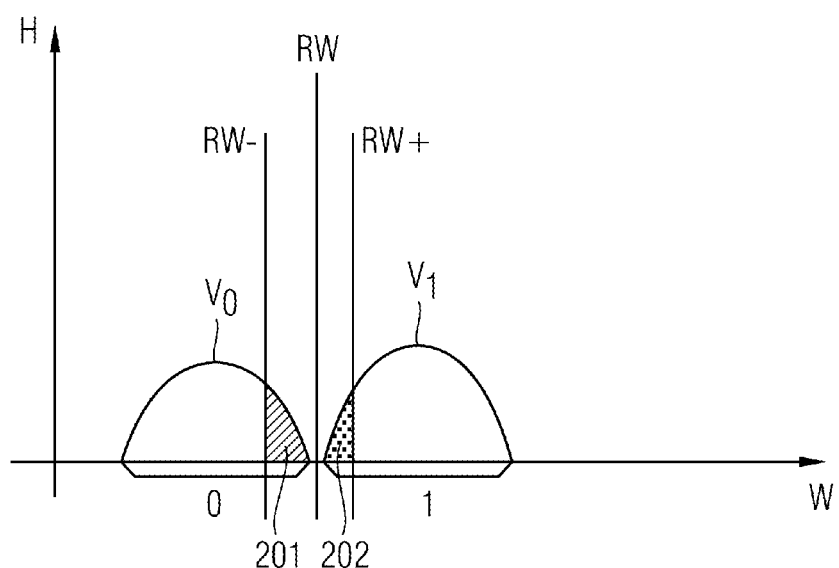
FIG. 2 shows a further distribution of the frequencies of physical values of memory cells in which a binary value 0 or 1 was stored, with a reference value that can be disturbed into an excessively large reference value or an excessively small reference value.

FIG. 2 shows, on the basis of the illustration from FIG. 1, the frequency distributions $V_0$ and $V_1$, which (still) do not overlap but have a small separation from one another. In such a case, it is advantageous to determine the reference value RW with high accuracy in order to prevent an assignment to the incorrect digital value from being carried out when the analog value read is compared with the reference value RW.

FIG. 2 also illustrates, alongside the reference value RW, deviating (e.g. disturbed) reference values RW⁻ and RW⁺, wherein the following holds true:

$$RW^- < RW < RW^+.$$

If the disturbed reference value RW⁻ is used, then a portion 201 of the physical values W which correspond to the binary value 0 is greater than the disturbed reference value RW⁻ and is incorrectly determined as the digital value 1.

If the disturbed reference value RW⁺ is used, then a portion 202 of the physical values W which correspond to the binary value 1 in the error-free case is less than the disturbed reference value RW⁺ and is incorrectly determined as the digital value 0.

It is possible to generate the reference value by means of a predefined cell, a so-called reference cell. During reading, the reference cell can output a physical value that lies between the physical value of a cell which was programmed with 0 and the physical value of a cell which was programmed with 1.

In this case, it is disadvantageous that reference cells additionally have to be provided on the chip and that the memory chip is not uniform. The reference cells can furthermore exhibit a different behavior than the other memory cells, e.g. with regard to the aging thereof.

One option is for the reference value to be generated using a memory cell programmed with 0, wherein the memory cell outputs one of the smaller physical values $W_{min}$ during reading. The value $W_{min}$ of a memory cell can then be increased e.g. by a predetermined offset Off in such a way that $$W_{min} + \text{Off}$$

can be used as reference value. In this case, the value $W_{min}$ will be different for the different cells programmed to 0. The reference value is thus dependent on the value $W_{min}$ of that cell programmed to 0 which determines the reference value. Consequently, the reference value can be erroneous in some cases. This effect can have a disadvantageous result particularly in the case of small separations between the frequency distributions of the physical values.

Furthermore, what is also disadvantageous here is that, particularly if a volatile or transient error occurs in the memory cell programmed to 0 which contributes the value $W_{min}$ to the reference value, the reference value becomes erroneous. Such an error cannot be identified by a test since it is not present permanently. For the duration of the transient error, therefore, an erroneous reference value can lead to a multiplicity of errors when reading out the stored binary values.

A further disadvantage is that a (temporary) error in the offset value Off provided, which likewise cannot be found in a test, can lead to an erroneous reference value.

One option is to generate the reference value using memory cells of identical type. In particular, the same memory cells as those used for storing digital information can be used for the reference value.

In this regard, it is possible, for example, to program a first cell with 0 and to program a further cell with 1 and to form the reference value RW as an arithmetic mean $$RW = \frac{W_0 + W_1}{2}$$

of the analog physical variables $W_0$ and $W_1$, wherein the physical variable $W_0$ is output during the reading of the first cell programmed with 0 and the physical variable $W_1$ is output during the reading of the further cell programmed with 1.

The cells programmed for forming the reference value, here the cells programmed with 0 and 1, can also be designated as half reference cells. A half reference cell programmed with 0 can be designated as a 0-reference cell, and a half reference cell programmed with 1 can be designated as a 1-reference cell. Half reference cells are, in particular, such memory cells which are programmed with a specific value and are used for forming reference values.

If, in the case where n different digital values can be stored in a memory cell, a memory cell in which a digital value q≥0 is stored is used for forming the reference value, said memory cell can be designated as q-reference cell. Equally, the memory cells which are programmed to a fixed value of the n possible digital values and are used for forming a reference value can likewise be designated as half reference cells.

If an error occurs in a half reference cell, e.g. by virtue of a 1-reference cell originally programmed to 1 erroneously assuming a state which corresponds to the state of a 0-reference cell programmed to 0, then the reference value formed as the arithmetic mean of the physical value $W_0$ output by the corresponding 0-reference cell and the physical value $W_1^e$ output erroneously by the 1-reference cell can be erroneous. If $W_1^e = W_0$, for example, then $RW^e = W_0$ results as erroneous reference value and a memory cell programmed to 0 can lead to an erroneous output 1. This behavior concerns both permanent errors and transient errors.

Figure 3:
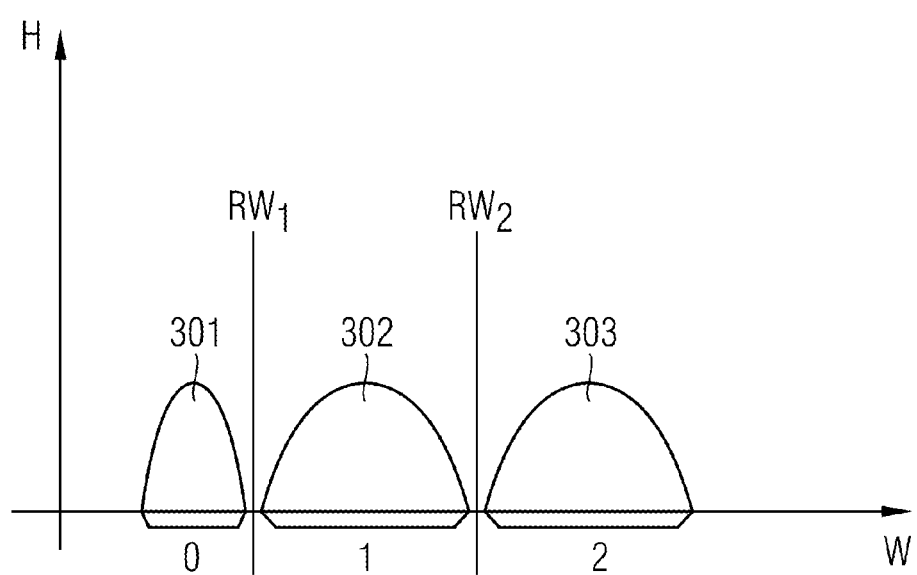
FIG. 3 shows a further distribution of the frequencies of physical values of memory cells in which a ternary value 0, 1 or 2 can be stored.

FIG. 3 shows by way of example a plurality of frequency distributions 301, 302 and 303 of a plurality of physical values W read out from a multiplicity of memory cells. Three different digital values 0, 1 and 2 can be stored in each of the memory cells, wherein the frequency distribution 301 corresponds to the digital value 0, the frequency distribution 302 corresponds to the digital value 1 and the frequency distribution 303 corresponds to the digital value 2.

Furthermore, FIG. 3 illustrates two reference values $RW_1$ and $RW_2$ in order to be able to distinguish the digital values stored in a memory cell. In the example shown it holds true that the digital value 0 is identified in a memory cell if the following holds true for the physical value W read: $W \leq RW_1$.

the digital value 1 is identified in a memory cell if the following holds true for the physical value W read: $RW_1 < W \leq RW_2$.

the digital value 2 is identified in a memory cell if the following holds true for the physical value W read: $RW_2 < W$.

A multiplicity of n−1 reference values $RW_1, \ldots, RW_{n-1}$ can likewise be used in order to be able to distinguish n different values stored in a memory cell.

If three different digital values can be stored in a memory cell, then the reference values $RW_1$ and $RW_2$ can be formed using half reference cells programmed with different digital values.

The reference value $RW_1$ can be formed from 0-reference cells programmed with 0 and 1-reference cells programmed with 1. The reference value $RW_2$ can be determined e.g. as a mean value of a physical value $W_1$ output by a 1-reference cell during reading and a value $W_2$ output by a 2-reference cell during reading.

If n different digital values can be stored in a memory cell, then the reference values $RW_k$ can be formed using half reference cells programmed with different digital values: The reference value $RW_k$ can be formed e.g. from k−1-reference cells programmed with k−1 and k-reference cells programmed with k. The reference value $RW_k$ can be determined as the mean value of a physical value $W_{k-1}$ output by a k−1-reference cell during reading and a value $W_k$ read out from a k-reference cell during reading.

By way of example, consideration is given to the case where two different binary values 0 and 1 can be stored in a memory cell. The physical value output during reading is then a current intensity, for example, the magnitude of which is determinable by a resistance value. If the memory cell is an MRAM cell, then an antiparallel alignment of the variable magnetization direction corresponds to a higher resistance value and thus to a small value of the current intensity. A parallel alignment of the variable magnetization direction corresponds to a lower value of the resistance and thus a larger value of the current intensity.

A smaller value of the current intensity can mean that a binary 0 was stored in the memory cell. A larger value of the current intensity can mean that a binary value 1 was stored in the memory cell.

If the reference value, which here is a reference current intensity, is too small, then it is possible for a binary 1 to be read out from the memory cell erroneously, even though a binary 0 was written to the cell. Such a case can occur, for example, if a 1-reference cell is erroneously at 0 (also designated as a "stuck-at-0" fault) or if a transient error occurs which disturbs the 1-reference cell in such a way that the reference current output by it during reading is too small.

It is also possible for the resistance of a 1-reference cell to be too large always or with a time limitation (e.g. owing to a temporary disturbance), such that the reference current output by the faulty 1-reference cell is too small. An excessively small reference current IR can then arise, such that a memory cell written to with 0 beforehand erroneously outputs a 1 during reading.

If a reference value is used for reading a plurality of memory cells, then an erroneous reference value can lead to a plurality of errors during reading. This is particularly disadvantageous since a plurality of data errors can arise as a result of a single error in a reference value.

Figure 4:
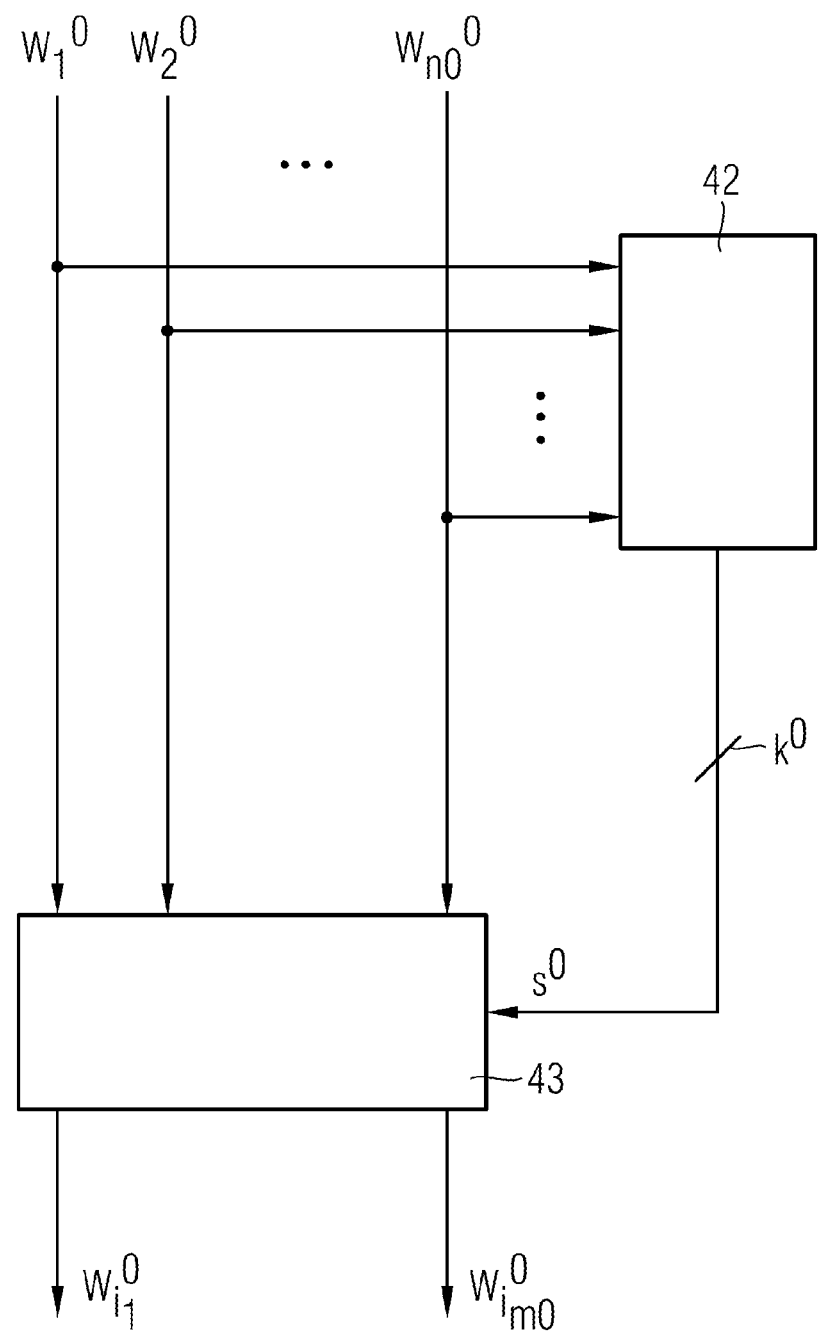
FIG. 4 shows a circuit arrangement for selecting half reference values.

FIG. 4 shows a circuit arrangement for determining a subset of half reference values $W_{i_1}^0, \ldots, W_{i_{m0}}^0$ from a set $W_1^0, W_2^0, \ldots, W_{n0}^0$ of half reference values, wherein $m0 < n0$ holds true.

In FIG. 4 it is assumed by way of example that the half reference values under consideration are 0-reference values which are output by 0-reference cells programmed to 0.

A control signal forming unit 42 forms a $k^0$-bit wide digital control signal $s^0$ depending on half reference values $W_1^0, W_2^0, \ldots, W_{n0}^0$ present at its inputs and provides said control signal to a selection circuit 43. The half reference values $W_1^0, W_2^0, \ldots, W_{n0}^0$ are fed to the selection circuit 43 via n0 inputs and said selection circuit provides the subset of half reference values $W_{i_1}^0, \ldots, W_{i_{m0}}^0$ via m0 outputs.

The selection circuit 43 outputs at its m0 outputs, depending on the value of the control signal $s^0$, a subset $W_{i_1}^0, \ldots, W_{i_{m0}}^0$ of the half reference values $W_1^0, W_2^0, \ldots, W_{n0}^0$ present at its n0 inputs, such that the following holds true:

$$\{W_{i_1}^0, \ldots, W_{i_{m0}}^0\} \subset \{W_1^0, W_2^0, \ldots, W_{n0}^0\}.$$

The control signal forming unit 42 forms the digital control signal $s^0$ output by it on the basis of comparisons of the values of the half reference values present at its inputs.

The control signal forming unit 42 and the selection circuit 43 are conFIG.d in accordance with FIG. 4 by way of example in such a way that if a half reference value $W_{k_1}^0$ is disturbed to an erroneous half reference value $W_{k_1}^{0e}$ and if no further half reference value is erroneous, the control signal forming unit 42 determines the control signal $s^0$ in such a way that the selection circuit 43 outputs only half reference values $W_{i_1}^0, \ldots, W_{i_{m0}}^0$ which are not erroneous. In other words: The selection circuit 43 outputs (only) correct half reference values at least if none or only one of the n0 half reference values at its n0 inputs is erroneous.

The circuit arrangement from FIG. 4 is thus error-tolerant with respect to an erroneous half reference value which is output by a 0-reference cell. Examples of embodiments of the control signal forming unit 42 and of the selection circuit 43 are described below.

Figure 5:
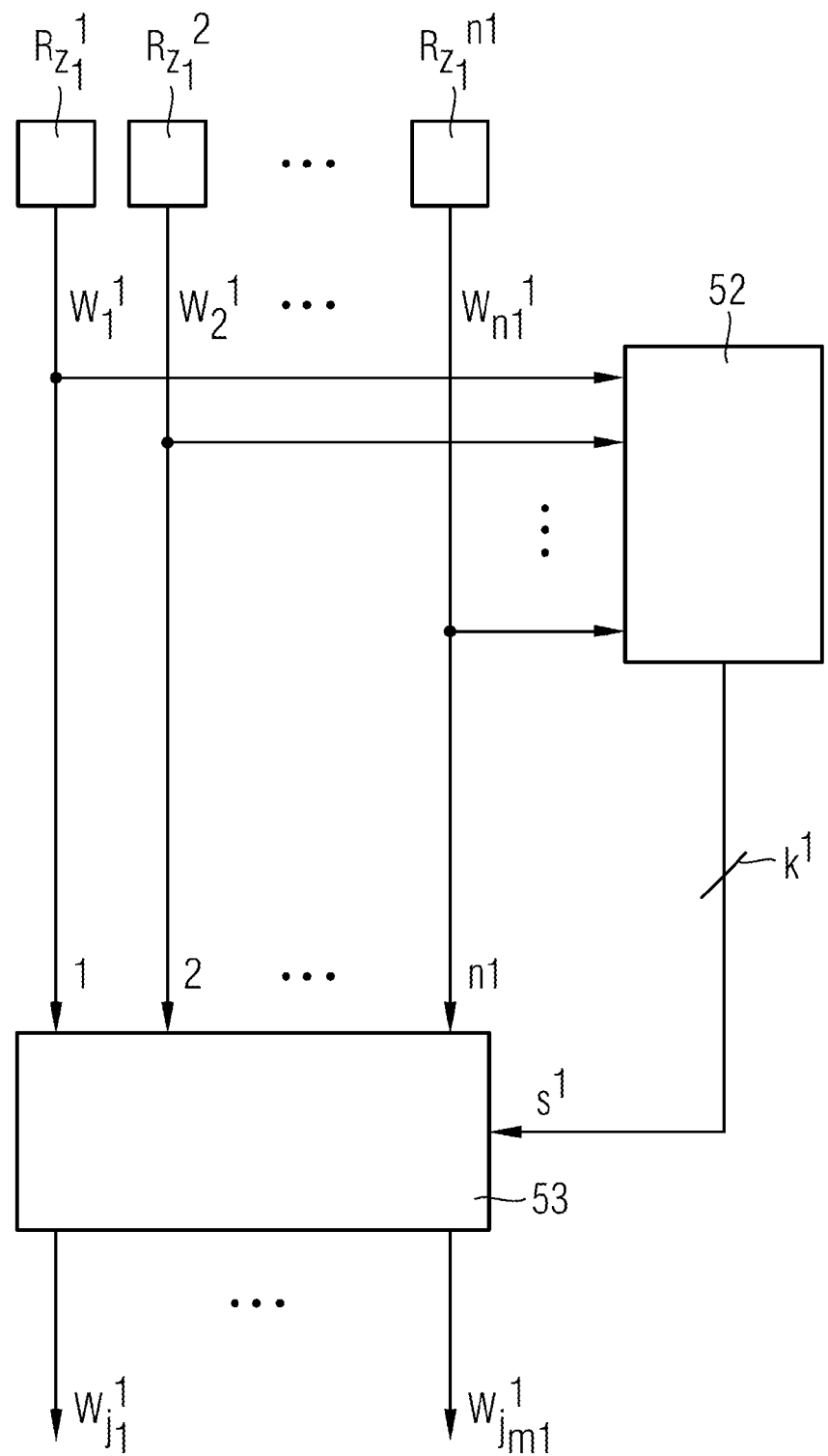
FIG. 5 shows a further circuit arrangement for selecting half reference values.

FIG. 5 shows a circuit arrangement for determining a subset of half reference values $W_{j_1}^1, \ldots, W_{j_{m1}}^1$. The circuit arrangement from FIG. 5 comprises a number of n1 memory cells $R_{z_1}^1$ to $R_{z_1}^{n1}$ programmed with the value 1, which are designated as 1-reference cells and which output n1 analog values $W_1^1, W_2^1, \ldots, W_{n1}^1$ during reading. Said n1 memory cells $R_{z_1}^1$ to $R_{z_1}^{n1}$ form n1 half reference values. Furthermore, FIG. 5 shows a control signal forming unit 52, which forms a $k^1$-bit-wide binary control signal $s^1$ depending on the half reference values $W_1^1, W_2^1, \ldots, W_{n1}^1$ output by the 1-reference cells $R_{z_1}^1$ to $R_{z_1}^{n1}$ and provides said control signal to a selection circuit 53.

The half reference values $W_1^1, W_2^1, \ldots, W_{n1}^1$ are fed to the selection circuit 53 via n1 inputs and said selection circuit provides the subset of half reference values $W_{j_1}^1, \ldots, W_{j_{m1}}^1$ via m1 outputs.

In this case, the following hold true, in particular: $k^1 \geq 1$, $n1 \geq 2$, $m1 < n1$ and $m1 \geq 1$.

The outputs of the n1 reference cells $R_{z_1}^1$ to $R_{z_1}^{n1}$ which provide the analog half reference values $W_1^1, W_2^1, \ldots, W_{n1}^1$ during reading are connected to the n1 first inputs of the selection circuit 53.

The selection circuit 53 outputs at its m1 outputs, depending on the value of the control signal $s^1$ the subset of half reference values $W_{j_1}^1, \ldots, W_{j_{m1}}^1$ of the half reference values $W_1^1, W_2^1, \ldots, W_{n1}^1$ present at its n1 inputs, such that the following holds true:

$$\{W_{j_1}^1, \ldots, W_{j_{m1}}^1\} \subset \{W_1^1, W_2^1, \ldots, W_{n1}^1\}.$$

The control signal forming unit 52 and the selection circuit 53 are conFIG.d in accordance with FIG. 5 by way of example in such a way that if a half reference value $W_{q_1}^1$, is disturbed to an erroneous half reference value $W_{q_1}^{1e}$ and if no further half reference value is erroneous, the selection circuit 53 outputs only correct half reference values $W_{j_1}^1, \ldots, W_{j_{m1}}^1$. In other words: The selection circuit 53 outputs only correct half reference values at least if none or only one of the n1 half reference values at its n1 inputs is erroneous.

The circuit arrangement from FIG. 5 is thus error-tolerant with respect to an erroneous half reference value which is output by one of the 1-reference cells $R_{z_1}^1$ to $R_{z_1}^1$. Examples of embodiments of the control signal forming unit 52 and of the selection circuit 53 are described below.

In this case, it is not necessary for n1=n0 and/or m1=m0 to hold true.

The selection circuit 53 can be embodied functionally identically to the selection circuit 43. However, it is also possible for both selection circuits to be embodied such that they are of different types.

In FIG. 4 and in FIG. 5, the selection circuits 43 and 53 are provided for the selection of half reference values $W_{i_1}^0, \ldots, W_{i_{m0}}^0$ and $W_{j_1}^1, \ldots, W_{j_{m1}}^1$ respectively, which can be provided by half reference cells programmed with 0 or with 1 during reading.

If memory cells are present which store more than two digital values (the n-ary memory cells explained above), then correspondingly further selection circuits for further half reference values can be formed. If a memory cell allows the storage of three digital values 0, 1 and 2, for example, then a further selection circuit using 2-reference cells can be provided.

If memory cells are present which can store n different digital values 0, 1, 2, . . . , n−1, selection circuits for forming n−1 reference values can correspondingly be provided.

Figure 6:
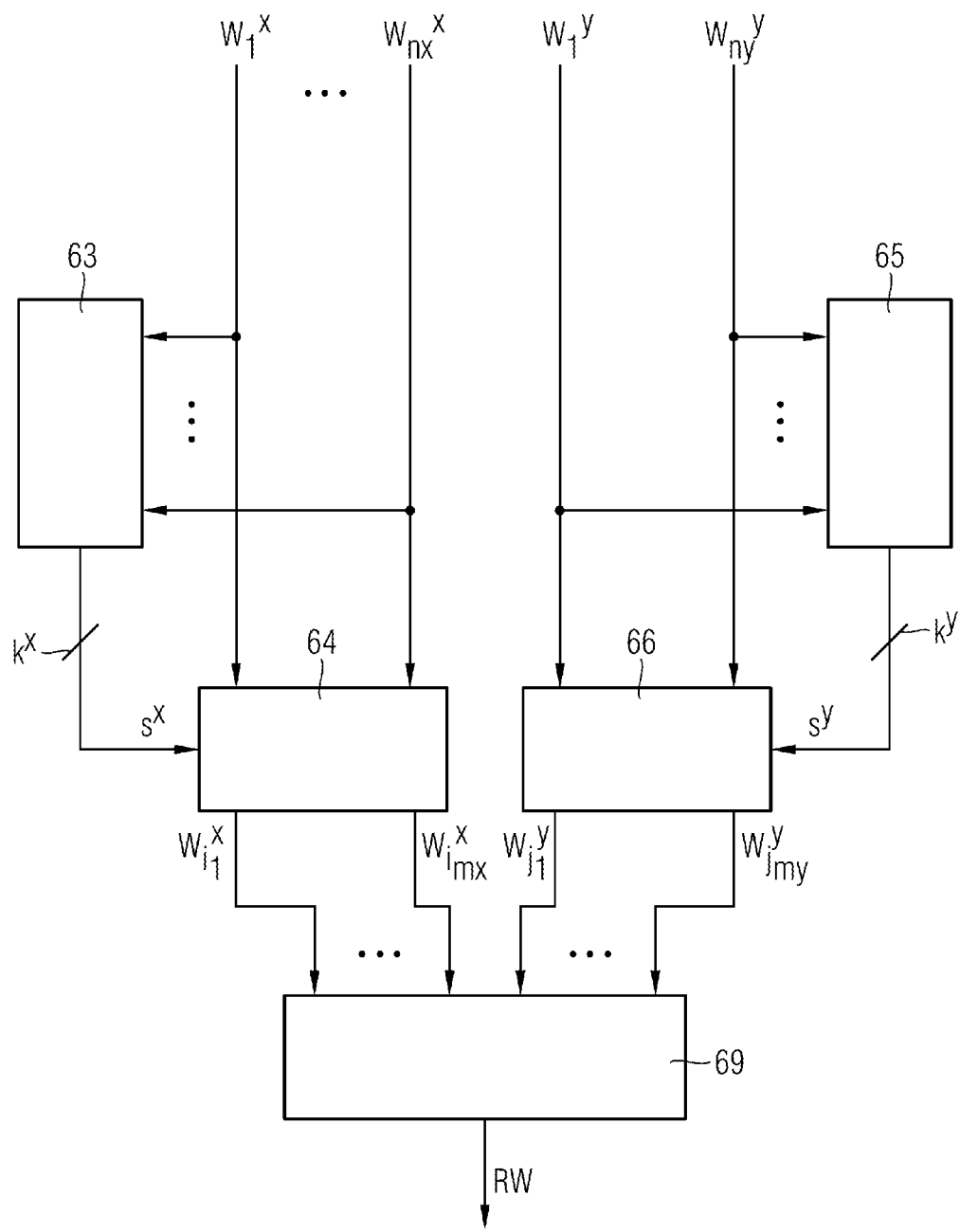
FIG. 6 shows a circuit arrangement for forming a reference value.

FIG. 6 shows a circuit arrangement for forming a reference value RW using x-reference values $W_1^x, \ldots, W_{nx}^x$ and y-reference values $W_1^y, \ldots, W_{my}^y$. In this case, by way of example, nx, ny≥2 can hold true.

For memory cells which can store binary values 0 and 1, x=0 and y=1 can be predefined.

For memory cells which can store ternary values 0, 1 and 2, x=1 and y=2 can be chosen.

For memory cells which store 8 different values, e.g. x=6 and y=7 can hold true.

The circuit arrangement shown in FIG. 6 comprises a control signal forming unit 63 for forming a binary control signal $s^x$ having the word width $k^x$ where $k^x \geq 1$ on the basis of half reference values $W_1^x, \ldots, W_{nx}^x$ present at its nx inputs. The control signal $s^x$ is fed to a selection circuit 64. The selection circuit 64 provides half reference values $W_{i_1}^x, \ldots, W_{i_{mx}}^x$ at mx outputs on the basis of the control signal $s^x$ and the half reference values $W_1^x, \ldots, W_{nx}^x$. In this case, in particular, mx<nx holds true and the half reference values $W_{i_1}^x, \ldots, W_{i_{mx}}^x$ are a proper subset of the half reference values $W_1^x, \ldots, W_{nx}^x$.

Furthermore, a control signal forming unit 65 is provided for forming a binary control signal $s^y$ having the word width $k^y$ where $k^y \geq 1$ on the basis of half reference values $W_1^y, \ldots, W_{my}^y$ present at its ny inputs. The control signal $s^y$ is fed to a selection circuit 66. The selection circuit 66 provides half reference values $W_{j_1}^y, \ldots, W_{j_{my}}^y$ at my outputs on the basis of the control signal $s^y$ and the half reference values $W_1^y, \ldots, W_{my}^y$. In this case, in particular, my<ny holds true and the half reference values $W_{j_1}^y, \ldots, W_{j_{my}}^y$ are a proper subset of the half reference values $W_1^y, \ldots, W_{my}^y$.

A reference value forming unit 69 is also provided, which determines the reference value RW on the basis of the mx half reference values $W_{i_1}^x, \ldots, W_{i_{mx}}^x$ which are output by the selection circuit 64 and the my half reference values $W_{j_1}^y, \ldots, W_{j_{my}}^y$ which are output by the selection circuit 66, and provides said reference value at an output.

The reference value forming unit 69 can be embodied in various ways. By way of example, it is possible for the reference value RW to be determined as an arithmetic mean on the basis of the half reference values present at its inputs in accordance with:

$$RW = \frac{W_{i_1}^x + \ldots + W_{i_{mx}}^x + W_{j_1}^y + \ldots + W_{j_{my}}^y}{mx + my}.$$

This can be advantageous, in particular, if mx=my holds true.

In accordance with one example embodiment, mx=my=1 can hold true, such that the selection circuits 64 and 66 select and output only one individual half reference value in each case. The reference value RW can then be determined as an arithmetic mean value in accordance with $$RW = \frac{W_{i_1}^x + W_{j_1}^y}{2}.$$

One option is to determine the reference value as a weighted arithmetic mean value in accordance with $$RW = \frac{a \cdot W_{i_1}^x + b \cdot W_{j_1}^y}{a+b}$$

wherein in particular a, b>0 can hold true.

It is likewise possible for the reference value forming unit 69 to have a further input for inputting an external signal ExR (not illustrated in FIG. 6). This can involve an expected reference value, for example, which is corrected by the half reference values determined by the selection circuits 64, 66 such that for example $$RW = \frac{a \cdot W_{i_1}^x + b \cdot W_{j_1}^y + c \cdot ExR}{a+b+c}$$

can hold true, wherein a, b, c>0 can hold true here.

It is also possible for the external signal ExR to be an incremental correction value.

Another alternative is to determine a plurality of different reference values RW, $RW^A$ and $RW^B$ from the half reference values determined by the selection circuits 64 and 66, e.g. in accordance with:

$$RW = \frac{W_{i_1}^x + W_{j_1}^y}{2}$$

-continued $$RW^A = \frac{a_1 \cdot W_{i_1}^x + b_1 \cdot W_{j_1}^y}{a_1 + b_1}$$

$$RW^B = \frac{a_2 \cdot W_{i_1}^x + b_2 \cdot W_{j_1}^y}{a_2 + b_2}.$$

As already noted, binary or n-ary values can be stored per memory cell. The generalization to the case which encompasses the storage of n values per memory cell is possible without difficulties. The determination of a plurality of difference reference values from half reference values can be expedient particularly if there is an overlap between the frequency distributions of the half reference values for example for the binary values 0 and 1.

Figure 13:
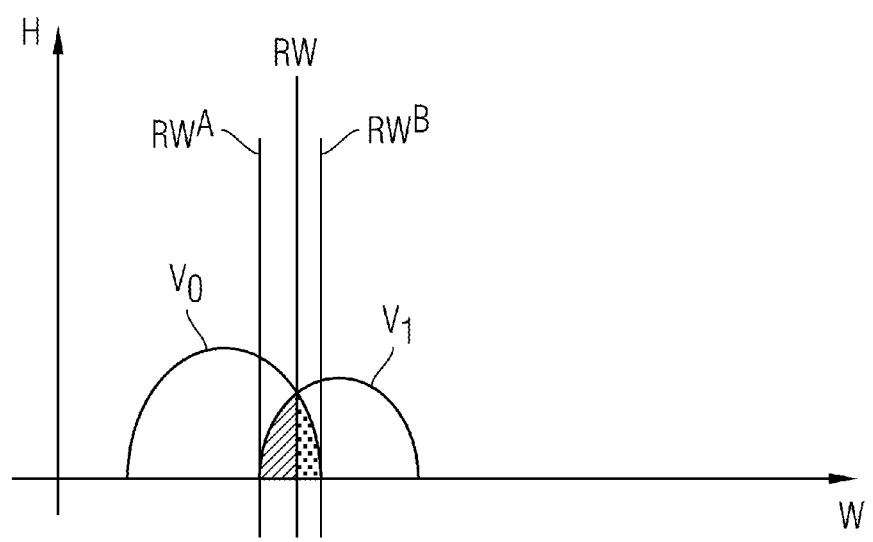
FIG. 13 shows a frequency distribution of overlapping half reference values with three reference values.

FIG. 13 shows, on the basis of the illustration from FIG. 1, the frequency distributions $V_0$ and $V_1$, which overlap. The reference value RW is arranged at the point of intersection of the overlap of the frequency distributions $V_0$ and $V_1$. Furthermore, a reference value $RW^A$ is determined in such a way that it is less than all the half reference values of the frequency distribution $V_1$ which correspond to a binary value 1. The reference value $RW^B$ is determined in such a way that all the half reference values which correspond to a binary value 0 are less than $RW^B$. If half reference values lie between the reference values $RW^A$ and $RW^B$, then a unique assignment of the physical value W read to one of the binary values 0 or 1 is not possible, which governs a certain error probability. Errors of this type for which the position is known, but not the concrete value, can be designated as so-called "erasure".

By way of example, $a_1=1$ and $b_1<1$ can be chosen for the determination of the reference value $RW^A$. By way of example, $a_2<1$ and $b_1=1$ can be chosen for the determination of the reference value $RW^B$.

By way of example, in the examples considered in the present case:

$$W_{i_1}^x < RW < W_{j_1}^y \text{ if } W_{i_1}^x < W_{j_1}^y \text{ holds true and}$$

$$W_{i_1}^x > RW > W_{j_1}^y \text{ if } W_{i_1}^x > W_{j_1}^y \text{ holds true.}$$

Generally, the reference value advantageously lies between the mean value of the x-half reference values and the mean value of the y-half reference values.

In this case, it should be noted that there are a multiplicity of possibilities for forming one or a plurality of reference values from half reference values, and that the examples described are not restrictive.

Figure 7:
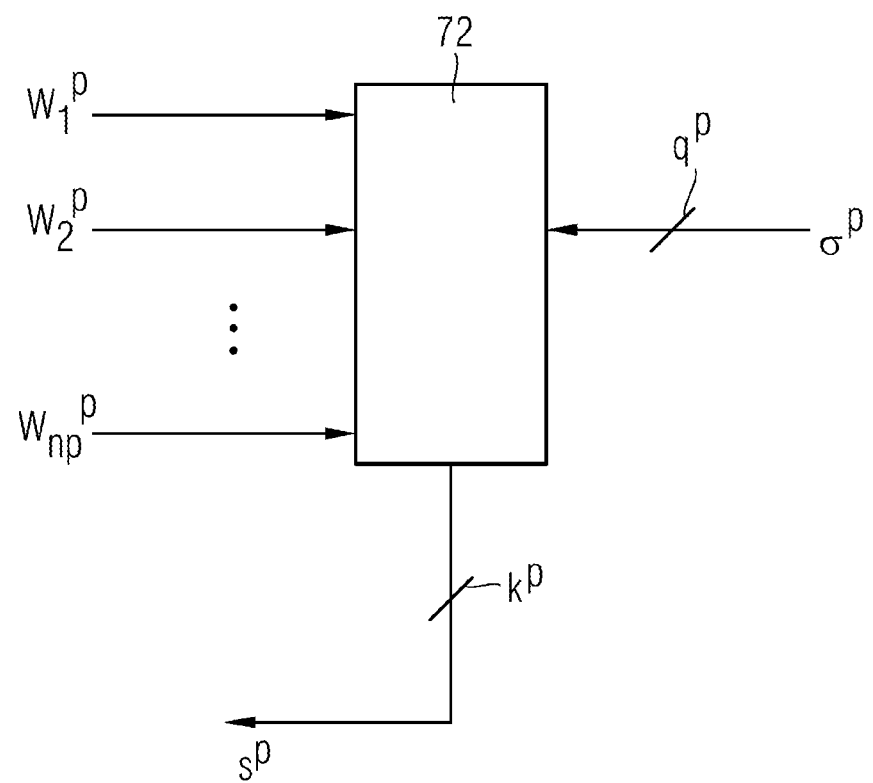
FIG. 7 shows an embodiment of a control signal forming unit.

FIG. 7 illustrates one example embodiment of a control signal forming unit 72. The analog values $W_1^p, \ldots, W_{np}^p$ obtained from p-reference cells during reading are present at np inputs of the control signal forming unit 72. At a further $q^p$-bit-wide input, a signal $\sigma^p$ generated externally, for example, is provided for the control signal forming unit 72. $q^p \geq 1$ can hold true. For the case where the memory cells store binary values, $p \in \{0,1\}$ holds true. If the memory cells can store n different values $0, 1, \ldots, n-1$, it correspondingly holds true that $p \in \{0, 1, 2, \ldots, n-1\}$.

The signal $\sigma^p$ provided externally and, if appropriate, generated externally can serve for identifying obviously erroneous half reference values $W_i^p$ where $i \in \{0, 1, \ldots, np\}$, for example by the half reference values being compared with the signal $\sigma^p$ and a control signal $s^p$ being determined in such a way that obviously erroneous half reference values are not selected for outputting by the corresponding selection circuit.

FIG. 8a shows one example embodiment of a circuit arrangement for determining a reference value RW. The circuit arrangement from FIG. 8a has a first subcircuit for determining a half reference value $W_{i_1}^0$ and a second subcircuit for determining a half reference value $W_{j_1}^1$. In this case, the half reference value $W_{i_1}^0$ is a 0-reference value and the half reference value $W_{j_1}^1$ is a 1-reference value.

The first subcircuit comprises three 0-reference cells $R_{z_0}^1$, $R_{z_0}^2$ and $R_{z_0}^3$ programmed to 0, a control signal forming unit 820 and a selection circuit 830.

During reading, the 0-reference cells $R_{z_0}^1$, $R_{z_0}^2$ and $R_{z_0}^3$ output the analog physical half reference values $W_1^0$, $W_2^0$ and $W_3^0$, which are fed both to the control signal forming unit 820 and to the selection circuit 830. The control signal forming unit 820 provides a 2-bit-wide control signal $s^0 = s_1^0$, $s_2^0$ to the selection circuit 830 via a $k^0=2$-bit-wide output. The selection circuit 830 provides the half reference value $W_{i_1}^0$ at its output to a mean value forming unit 84.

The second subcircuit comprises three 1-reference cells $R_{z_1}^1$, $R_{z_1}^2$ and $R_{z_1}^3$ programmed to 1, a control signal forming unit 821 and a selection circuit 831.

During reading, the 1-reference cells $R_{z_1}^1$, $R_{z_1}^2$ and $R_{z_1}^3$ output the analog physical half reference values $W_1^1$, $W_2^1$ and $W_3^1$, which are fed both to the control signal forming unit 821 and to the selection circuit 831. The control signal forming unit 821 provides a 2-bit-wide control signal $s^1 = s_1^1$, $s_2^1$ to the selection circuit 831 via a $k^1=2$-bit-wide output. The selection circuit 831 provides the half reference value $W_{j_1}^1$ at its output to the mean value forming unit 84.

The half reference value $W_{i_1}^0$ output by the selection circuit 830 corresponds to one of the three half reference values $W_1^0$, $W_2^0$ and $W_3^0$ present at its inputs. The selection of one of these half reference values is determined by the control signal $s^0$.

The half reference value $W_{j_1}^1$ output by the selection circuit 831 corresponds to one of the three half reference values $W_1^1$, $W_2^1$ and $W_3^1$ present at its inputs. The selection of one of these half reference values is determined by the control signal $s^1$.

The mean value forming unit 84 provides the reference value RW at its output in accordance with $$RW = \frac{W_{i_1}^0 + W_{j_1}^1}{2}.$$

Figure 8B:
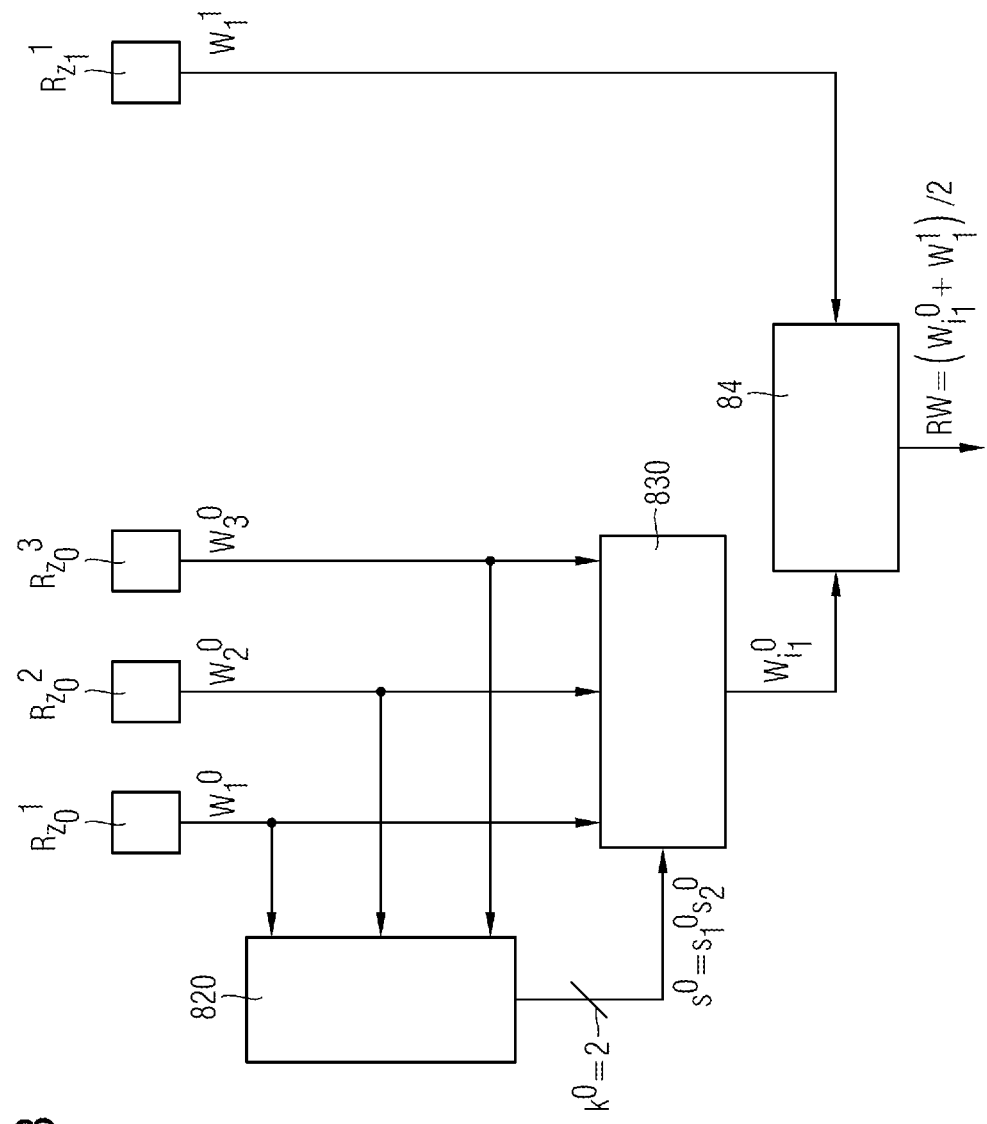
FIG. 8b shows a further circuit arrangement for forming a reference value.

FIG. 8b shows a further example embodiment of a circuit arrangement for determining a reference value RW. FIG. 8b corresponds in part to the circuit arrangement shown in FIG. 8a. Instead of the three 1-reference cells $R_{z_1}^1$, $R_{z_1}^2$ and $R_{z_1}^3$ from FIG. 8a, FIG. 8b shows only one individual 1-reference cell $R_{z_1}^1$, from which its physical half reference value $W_1^1$ read is fed directly into the mean value forming unit 84; the control signal forming unit 821 and the selection circuit 831 from FIG. 8a are omitted.

The reference value RW arises at the output mean value forming unit 84 as $$RW = \frac{W_{i_1}^0 + W_1^1}{2}.$$

Such an example embodiment can be advantageous if there is a very low probability of an error occurring for the 1-reference cells, while there is by comparison a higher probability of an error for the 0-reference cells.

An embodiment of a control signal forming unit and a corresponding selection circuit is indicated below, for example, which are conFIG.d such that, from three half reference values $W_1^0$, $W_2^0$ and $W_3^0$ present at their inputs, a median is selected, i.e. the middle value of the half reference values present at the inputs.

Figure 9A:
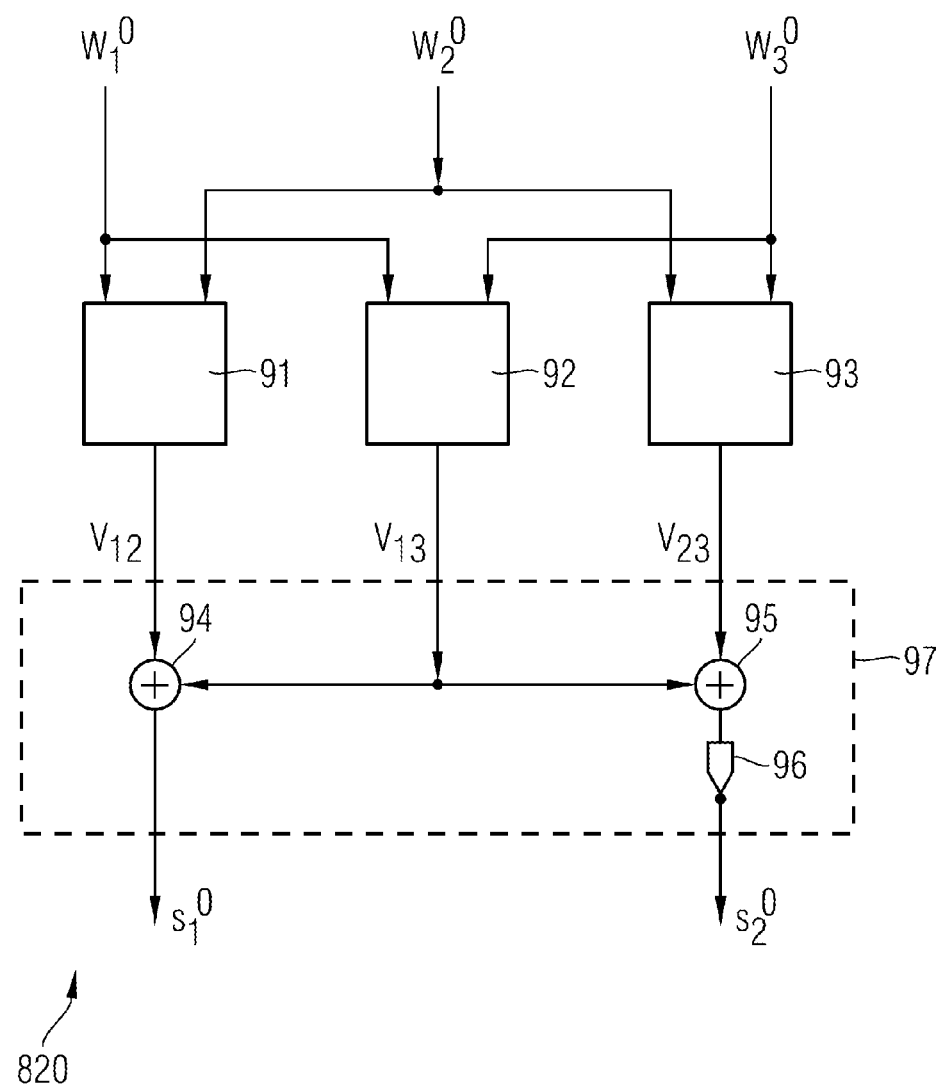
FIG. 9a shows an example embodiment of a control signal forming unit.

FIG. 9a shows one possible embodiment of a corresponding control signal forming unit 820. The control signal forming unit 820 has three inputs for inputting the three analog half reference values $W_1^0$, $W_2^0$ and $W_3^0$ and two outputs for outputting the binary components $s_1^0$, $s_2^0$ of the binary control signal $s^0$ for controlling the selection circuit 830. One possible realization of the selection circuit 830 is described below in association with FIG. 9a.

The control signal forming unit 820 comprises three comparators 91, 92 and 93 having in each case two inputs and in each case one output, and a combinatorial circuit 97 comprising two XOR gates 94 and 95 (XOR: exclusive-OR) and an inverter 96. Each of the XOR gates 94 and 95 has two inputs and one output.

The half reference value $W_1^0$ is applied to the first input of the comparator 91 and to the first input of the comparator 92. The half reference value $W_2^0$ is applied to the second input of the comparator 91 and to the first input of the comparator 93. The half reference value $W_3^0$ is applied to the second input of the comparator 92 and to the second input of the comparator 93.

A binary comparison signal $v_{12}$ is present at the output of the comparator 91 in accordance with:

$v_{12}=1$, if the following holds true: $W_1^0 \leq W_2^0$;
$v_{12}=0$, if the following holds true: $W_1^0 > W_2^0$.

A binary comparison signal $v_{13}$ is present at the output of the comparator 92 in accordance with:

$v_{13}=1$, if the following holds true: $W_1^0 \leq W_3^0$;
$v_{13}=0$, if the following holds true: $W_1^0 > W_3^0$.

A binary comparison signal $v_{23}$ is present at the output of the comparator 93 in accordance with:

$v_{23}=1$, if the following holds true: $W_2^0 \leq W_3^0$;
$v_{23}=0$, if the following holds true: $W_2^0 > W_3^0$.

The output of the comparator 91 is connected to the first input of an XOR gate 94. The output of the comparator 92 is connected to the second input of the XOR gate 94 and the first input of the XOR gate 95. The output of the comparator 93 is connected to the second input of the XOR gate 95.

The binary component $s_1^0$ is provided at the output of the XOR gate 94. The output of the XOR gate 95 provides the binary component $s_2^0$ via an inverter 96.

Figure 9B:
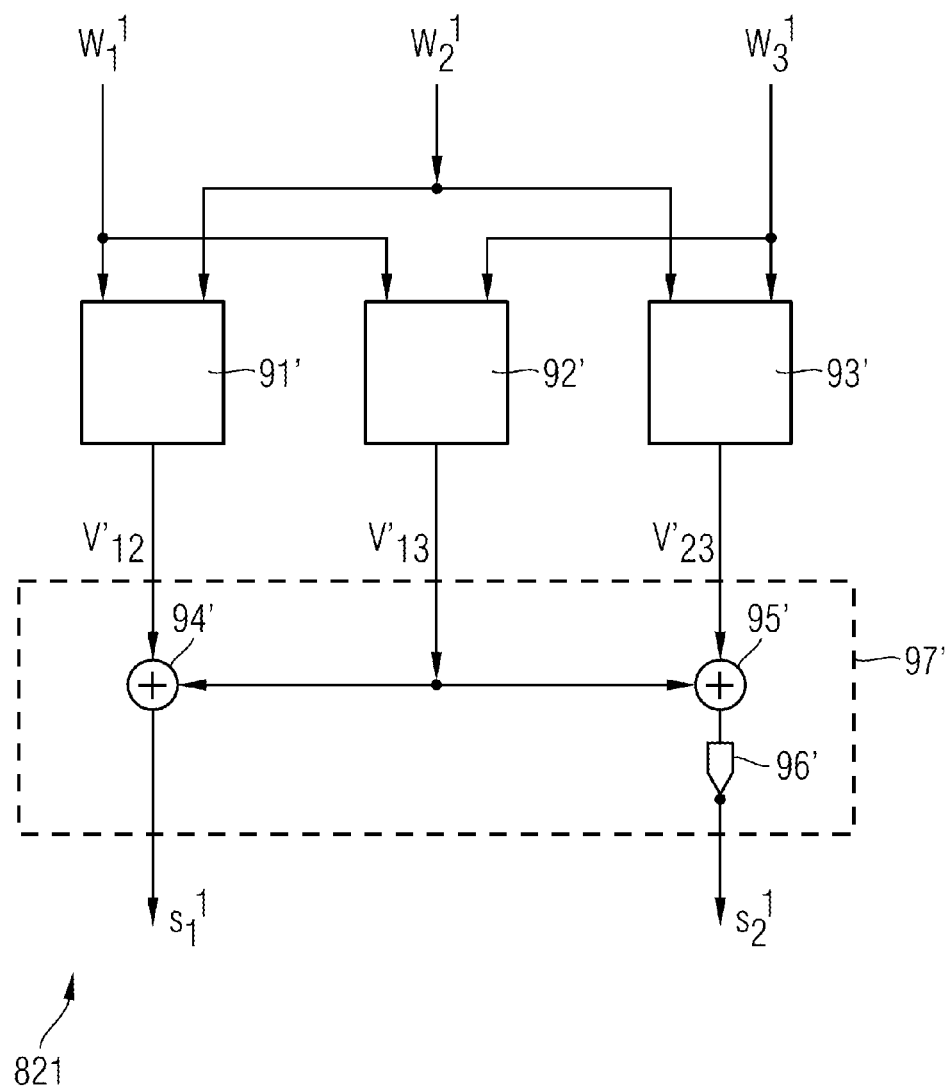
FIG. 9b shows a further example embodiment of a control signal forming unit.
Figure 9C:
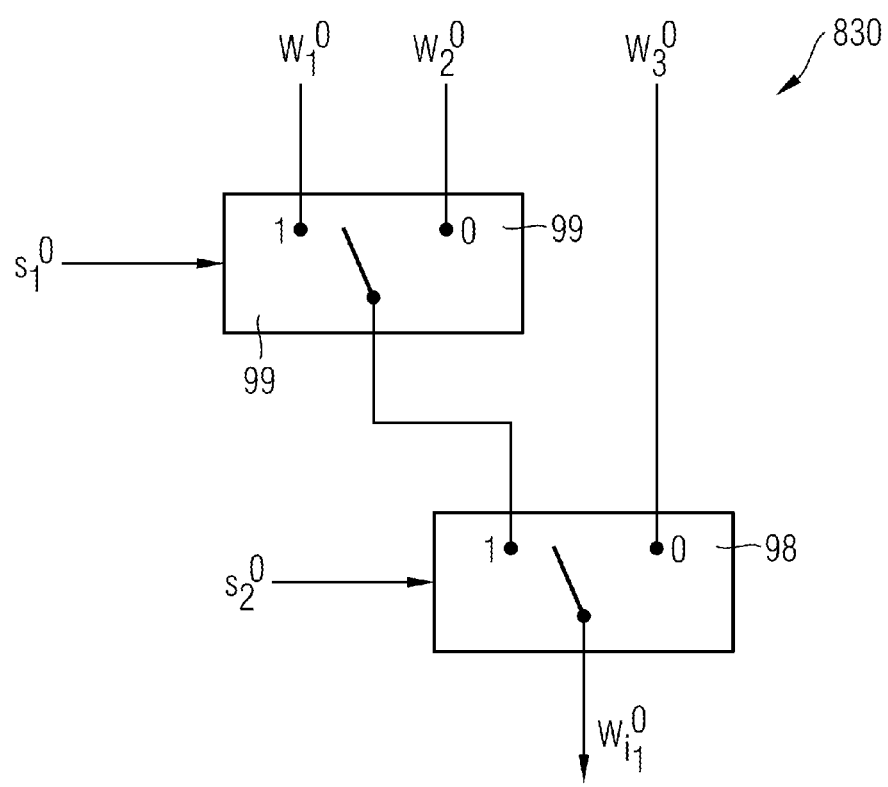
FIG. 9c shows a selection circuit.

FIG. 9c shows one possible realization of an associated selection circuit 830, comprising two multiplexers 98 and 99 having in each case two inputs (a 1-input and a 0-input) and in each case one output.

The half reference value $W_1^0$ is present at the 1-input of the multiplexer 99, and the half reference value $W_2^0$ is present at the 0-input of the multiplexer 99. The output of the multiplexer 99 is connected to the 1-input of the multiplexer 98 and the half reference value $W_3^0$ is present at the 0-input of the multiplexer 98.

The selected half reference value $W_i^0$ is provided at the output of the multiplexer 98. The multiplexer 99 is controlled by the binary component $s_1^0$ of the control signal forming unit 820 and the multiplexer 98 is controlled by the binary component $s_2^0$ of the control signal forming unit 820.

An explanation is given below, by way of example, of how a median value is determined from the three half reference values $W_1^0$, $W_2^0$ and $W_3^0$ by means of the control signal forming unit 820 shown in FIG. 9a and the selection circuit 830 shown in FIG. 9c and is provided at the output of the multiplexer 98.

For the half reference values $W_1^0$, $W_2^0$ and $W_3^0$ there are the following six possibilities:
(1) $W_1^0 \leq W_2^0 \leq W_3^0$ with the median $W_2^0$ and the comparison signals $v_{12}=1$, $v_{13}=1$ and $v_{23}=1$;
(2) $W_1^0 \leq W_3^0 \leq W_2^0$ with the median $W_3^0$ and the comparison signals $v_{12}=1$, $v_{13}=1$ and $v_{23}=0$;
(3) $W_2^0 \leq W_1^0 \leq W_3^0$ with the median $W_1^0$ and the comparison signals $v_{12}=0$, $v_{13}=1$ and $v_{23}=1$;
(4) $W_2^0 \leq W_3^0 \leq W_1^0$ with the median $W_3^0$ and the comparison signals $v_{12}=0$, $=v_{13}0$ and $v_{23}=1$;
(5) $W_3^0 \leq W_1^0 \leq W_2^0$ with the median $W_1^0$ and the comparison signals $v_{12}=1$, $v_{13}=0$ and $v_{23}=0$;
(6) $W_3^0 \leq W_2^0 \leq W_1^0$ with the median $W_2^0$ and the comparison signals $v_{12}=0$, $v_{13}=0$ and $v_{23}=0$.

The table illustrated below shows the dependencies of the comparison signals on the binary components of the control signal and the median determined:

| $v_{12}$ | $v_{13}$ | $v_{23}$ | $s_1^0$ | $s_2^0$ | Median |
|---|---|---|---|---|---|
| 0 | 0 | 0 | 0 | 1 | $W_2^0$ |
| 0 | 0 | 1 | — | 0 | $W_3^0$ |
| 0 | 1 | 0 | — | — | — |
| 0 | 1 | 1 | 1 | 1 | $W_1^0$ |
| 1 | 0 | 0 | 1 | 1 | $W_1^0$ |
| 1 | 0 | 1 | — | — | — |
| 1 | 1 | 0 | — | 0 | $W_3^0$ |
| 1 | 1 | 1 | 0 | 1 | $W_2^0$ |

The fields marked by "–" in the table remain undetermined and can be occupied arbitrarily.

From the table there follows as one possible realization of the components of the control signal (also see implementation in accordance with FIG. 9a)

$s_1^0 = v_{12} \oplus v_{13}$ and $s_1^0 = \overline{v_{13} \oplus v_{23}}$.

By way of example, if $v_{12}=0$, $v_{13}=0$ and $v_{23}=0$ (as illustrated in the first line of the table above), then $s_1^0=0$ and $s_2^0=1$ hold true and the multiplexer 99 in FIG. 9c connects its 0-input, at which the half reference value $W_2^0$ is present, to its output and thus to the 1-input of the multiplexer 98. The 1-input of the multiplexer 98 is connected to its output. Therefore, the half reference value $W_2^0$ is provided at the output of the multiplexer 98 and thus at the output of the selection circuit 830.

FIG. 9b shows one example embodiment of the control signal forming unit 821 in accordance with FIG. 8a. The control signal forming unit 821 has three inputs for inputting the three analog half reference values $W_1^1$, $W_2^1$ and $W_3^1$ (1-reference values) and two outputs for outputting the binary components $s_1^1$, $s_2^1$ of the binary control signal $s^1$ for controlling the selection circuit 831. The construction of the circuit shown in FIG. 9b otherwise corresponds to the illustration shown in FIG. 9a, the individual components being identified by a prime in contrast to the components of FIG. 9a. Thus, the control signal forming unit 821 comprises three comparators 91', 92', 93' and a combinatorial circuit 97' comprising two XOR gates 94', 95' and an inverter 96'. The functioning corresponds to that of the control signal forming unit 820.

Figure 9D:
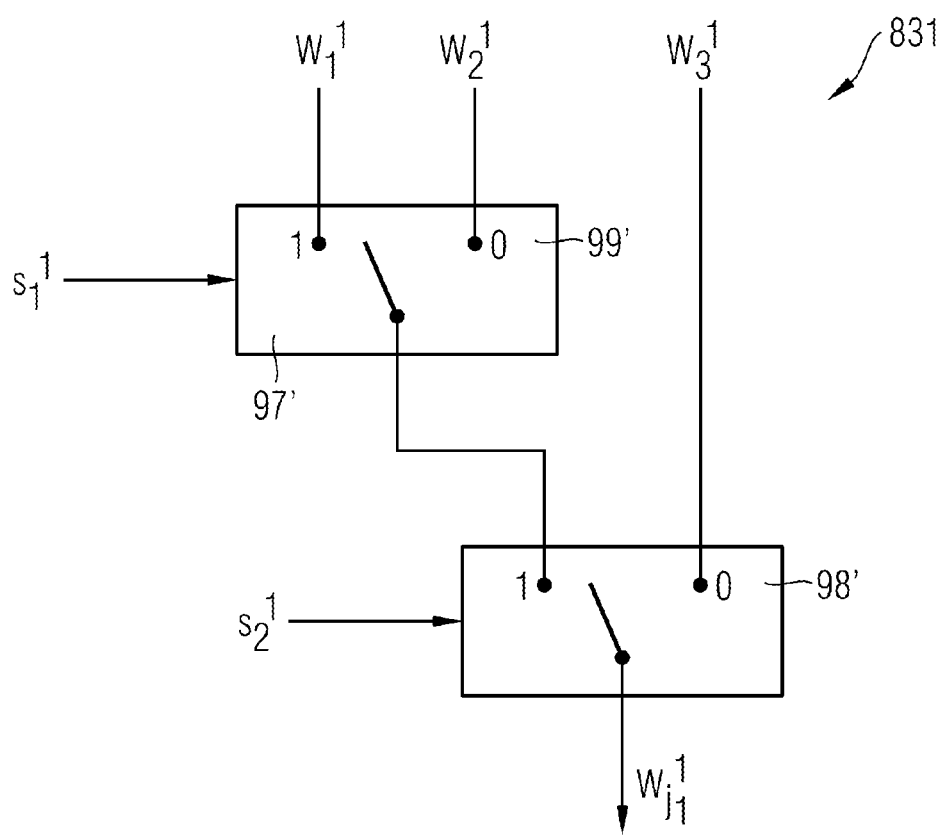
FIG. 9d shows a further selection circuit.

FIG. 9d shows one example embodiment of the selection circuit 831 in accordance with FIG. 8a comprising two multiplexers 98' and 99' having in each case two inputs (a 1-input and a 0-input) and in each case one output. The construction of the circuit shown in FIG. 9d largely corresponds to the construction of the circuit shown in FIG. 9c. Instead of the input signals shown in FIG. 9c, in FIG. 9d the half reference values $W_1^1$, $W_2^1$ and $W_3^1$ (1-reference values) are present at the multiplexers 98' and 99'. The half reference value $W_{j_1}^1$ selected by means of the binary components $s_1^1$, $s_2^1$ originating from the control signal forming unit 821 is provided at the output of the multiplexer 98'. By way of example, this is a median of the half reference values $W_1^1$, $W_2^1$ and $W_3^1$ present at the inputs.

Figure 9E:
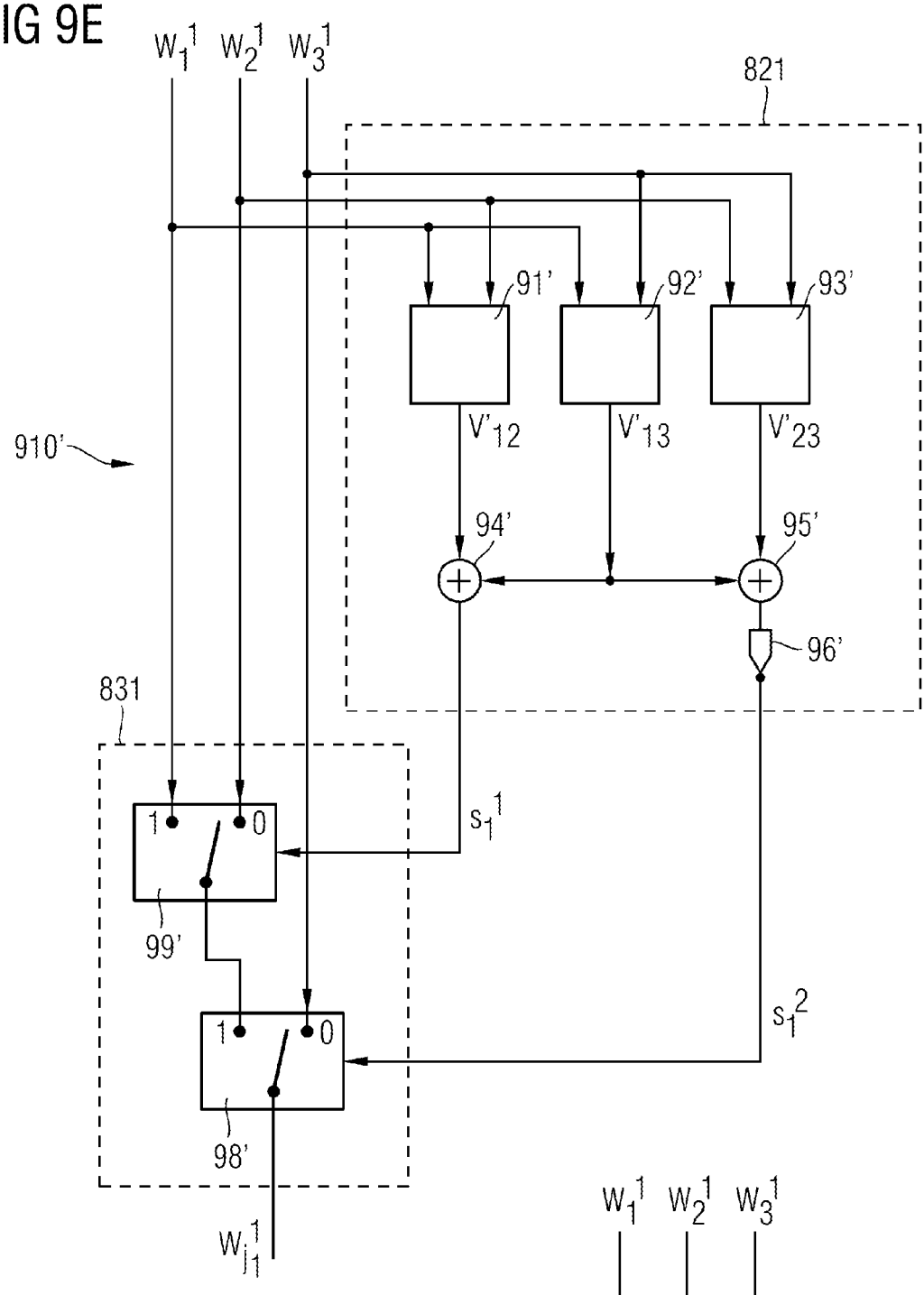
FIG. 9e shows the interconnection of a selection circuit and a control signal forming unit to form a median forming unit.

FIG. 9e illustrates a median forming unit 910' as a combination of the control signal forming unit 821 from FIG. 9b with the selection circuit 831 from FIG. 9d. The explanations above are correspondingly applicable.

For elucidating the property of error tolerance, it shall be assumed that the half reference values $W_1^1$ and $W_3^1$ are correct 1-half reference values and that the half reference value $W_2^1$ is erroneously too small. By way of example, $W_1^1 < W_3^1$ shall hold true, wherein the half reference values $W_1^1$ and $W_3^1$ are intended to differ from one another only insignificantly since both are correct half reference values. The following holds true in this case:

$$v'_{12}=0, \ v'_{13}=1 \text{ and } v'_{23}=1$$

and furthermore $$s_1^1 = v'_{12} \oplus v'_{13} = 1$$

$$s_1^1 = \overline{v'_{13} \oplus v'_{23}} = 0.$$

Therefore, the half reference value $W_3^1$ is output by the median forming unit 910'. The half reference value $W_2^1$ that is erroneously too small is not provided; the circuit is thus error-tolerant with respect to the error that the half reference value $W_2^1$ is permanently or temporarily (i.e. transiently) erroneous.

Figure 9F:
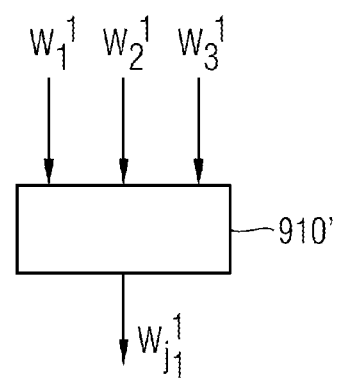
FIG. 9f shows a simplified block diagram of the median forming unit.

FIG. 9f illustrates a simplified block diagram of the median forming unit 910' on the basis of the input and output signals thereof.

Figure 10:
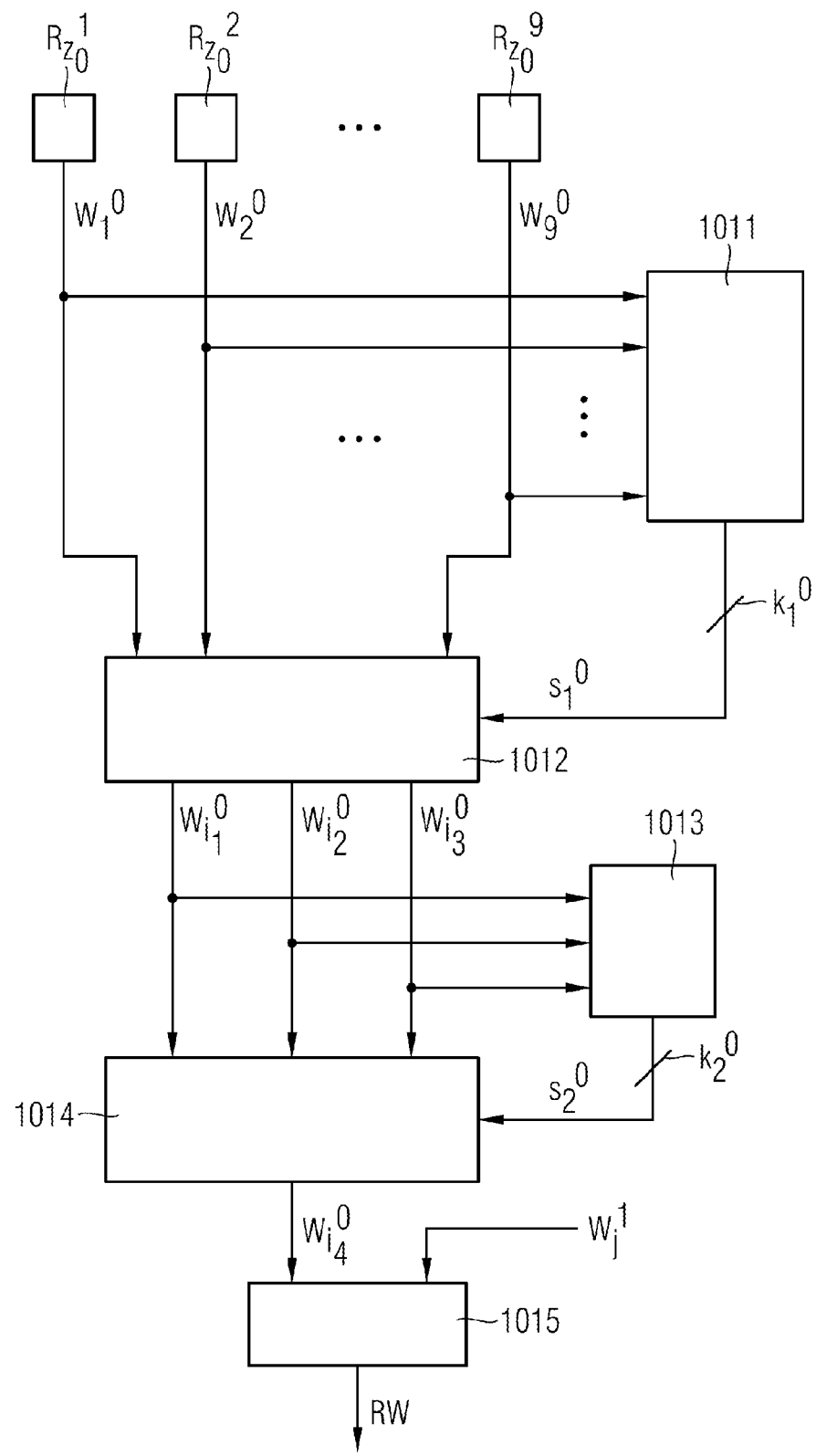
FIG. 10 shows a circuit arrangement for combining two selection circuits and two control signal forming units for forming a reference value.

FIG. 10 shows an example circuit which determines a reference value RW on the basis of a half reference value $W_{i_4}^0$ and a half reference value $W_j^1$.

The half reference value $W_{i_4}^0$ is selected from half reference values $W_1^0, W_2^0, \ldots, W_9^0$, wherein the half reference values $W_1^0, W_2^0, \ldots, W_9^0$ are determined during reading from 0-reference cells $R_{z_0}^1$ to $R_{z_0}^9$.

The half reference values $W_1^0, W_2^0, \ldots, W_9^0$ are fed to a selection circuit 1012 and also to a control signal forming unit 1011. The control signal forming unit 1011 generates the control signal $s_1^0$ on the basis of the half reference values $W_1^0, W_2^0, \ldots, W_9^0$ and forwards it to the selection circuit 1012.

The selection circuit 1012 provides three selected half reference values $W_{i_1}^0$, $W_{i_2}^0$ and $W_{i_3}^0$ at three outputs. By way of example, the control signal $s_1^0$ is an at least $k_1^0=7$-bit-wide signal since 3 values can be selected from 9 values in $$\binom{9}{3} = 84$$

different ways ($2^7=128 \geq 84$). The order of the selected values is not taken into account here.

The half reference values $W_{i_1}^0$, $W_{i_2}^0$ and $W_{i_3}^0$ are fed to a selection circuit 1014 and also to a control signal forming unit 1013. The control signal forming unit 1013 generates the control signal $s_2^0$ on the basis of the half reference values $W_{i_1}^0$, $W_{i_2}^0$ and $W_{i_3}^0$ and forwards it to the selection circuit 1014.

The selection circuit 1014 provides the selected half reference value $W_{i_4}^0$ at its output. By way of example, the control signal $s_2^0$ is a 2-bit-wide signal (there are 3 possibilities for selecting one value from 3 values).

The half reference value $W_{i_4}^0$ originating from one of the 0-reference cells is fed together with the half reference value $W_j^1$ originating from a 1-reference cell to a reference value forming unit 1015. The selection of the half reference value $W_j^1$ can can be carried out in a manner similar to the selection of the half reference value $W_{i_4}^0$ or according to a different scheme. The reference value forming unit 1015 outputs the reference value RW at its output.

Figure 11:
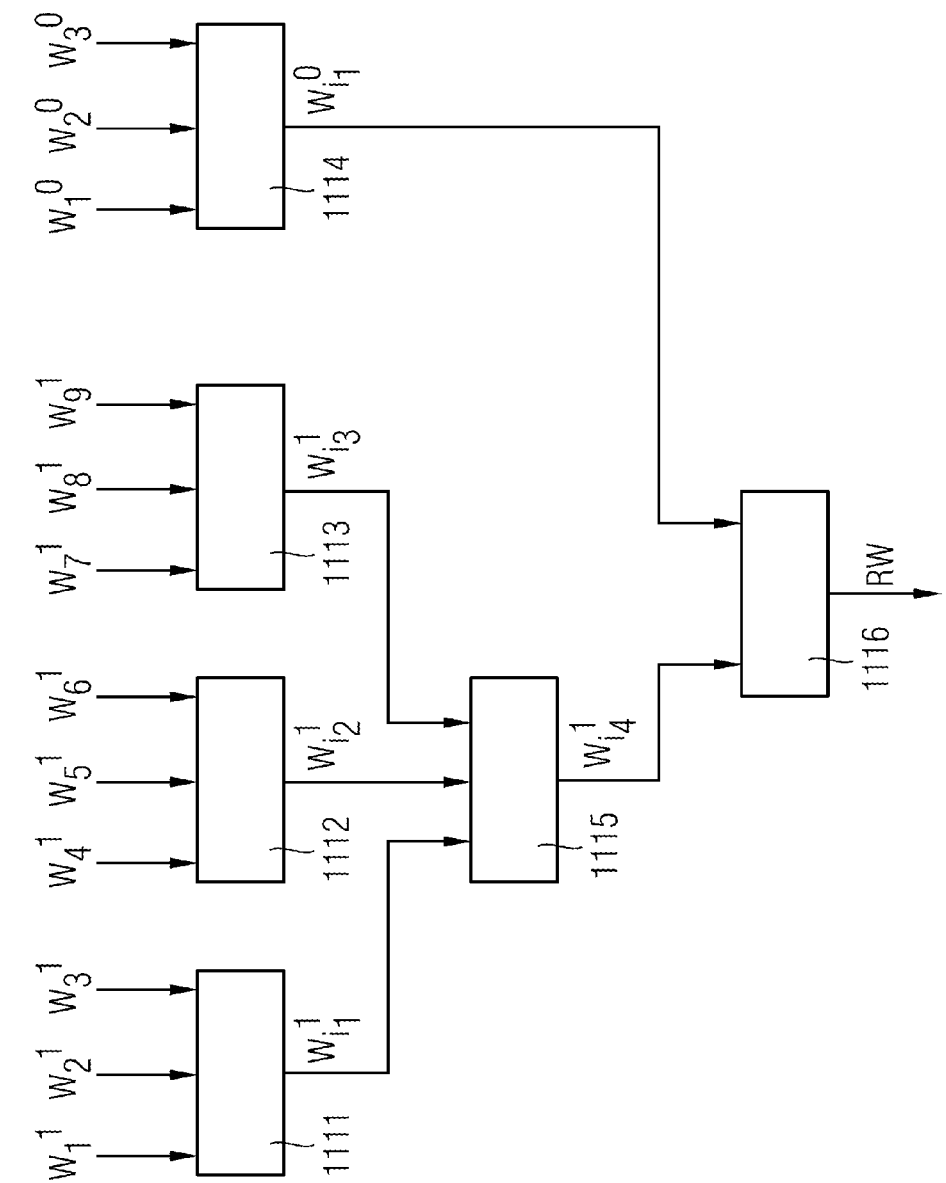
FIG. 11 shows a circuit arrangement for selecting half reference values and for forming reference values using median forming units.

FIG. 11 shows a schematic circuit as a further example for determining a reference value from 9 half reference values $W_1^1, W_2^1, \ldots, W_9^1$ (1-reference values) and from 3 half reference values $W_1^0$, $W_2^0$ and $W_3^0$ (0-reference values).

The selection of a subset is carried out in each case by a median forming unit 1111, 1112, 1113, 1114 and 1115, wherein the median forming unit can have a control signal forming unit and a selection circuit, as is illustrated by way of example in FIG. 9e (also see FIG. 9f).

The median forming unit 1111 selects a median $W_{i_1}^1$ from the half reference values $W_1^1$, $W_2^1$, $W_3^1$ and forwards said median to the median forming unit 1115. The median forming unit 1112 selects a median $W_{i_2}^1$ from the half reference values $W_4^1$, $W_5^1$, $W_6^1$ and forwards said median to the median forming unit 1115. The median forming unit 1113 selects a median $W_{i_3}^1$ from the half reference values $W_7^1$, $W_8^1$, $W_9^1$ and forwards said median to the median forming unit 1115. The median forming unit 1114 selects a median $W_{j_1}^0$ from the half reference values $W_1^0, W_2^0, W_3^0$ and forwards said median to a reference value forming unit 1116. The median forming unit 1115 selects a median $W_{i_4}^1$ from the median half reference values $W_{i_1}^1$, $W_{i_2}^1$, $W_{i_3}^1$ and forwards said median to the reference value forming unit 1116. The reference value forming unit 1116 provides a reference value RW at its output.

By way of example, the following holds true here:

$$RW < W_{i_4}^1, \ RW > W_{j_1}^0 \text{ and } W_{i_1}^1 > W_{j_1}^0.$$

Correspondingly, the reference value forming unit 1116 can be embodied in accordance with one example in such a way that the following holds true (where a, b>0):

$$RW = \frac{a \cdot W_{i_4}^1 + b \cdot W_{j_1}^0}{a + b}.$$

Figure 12:
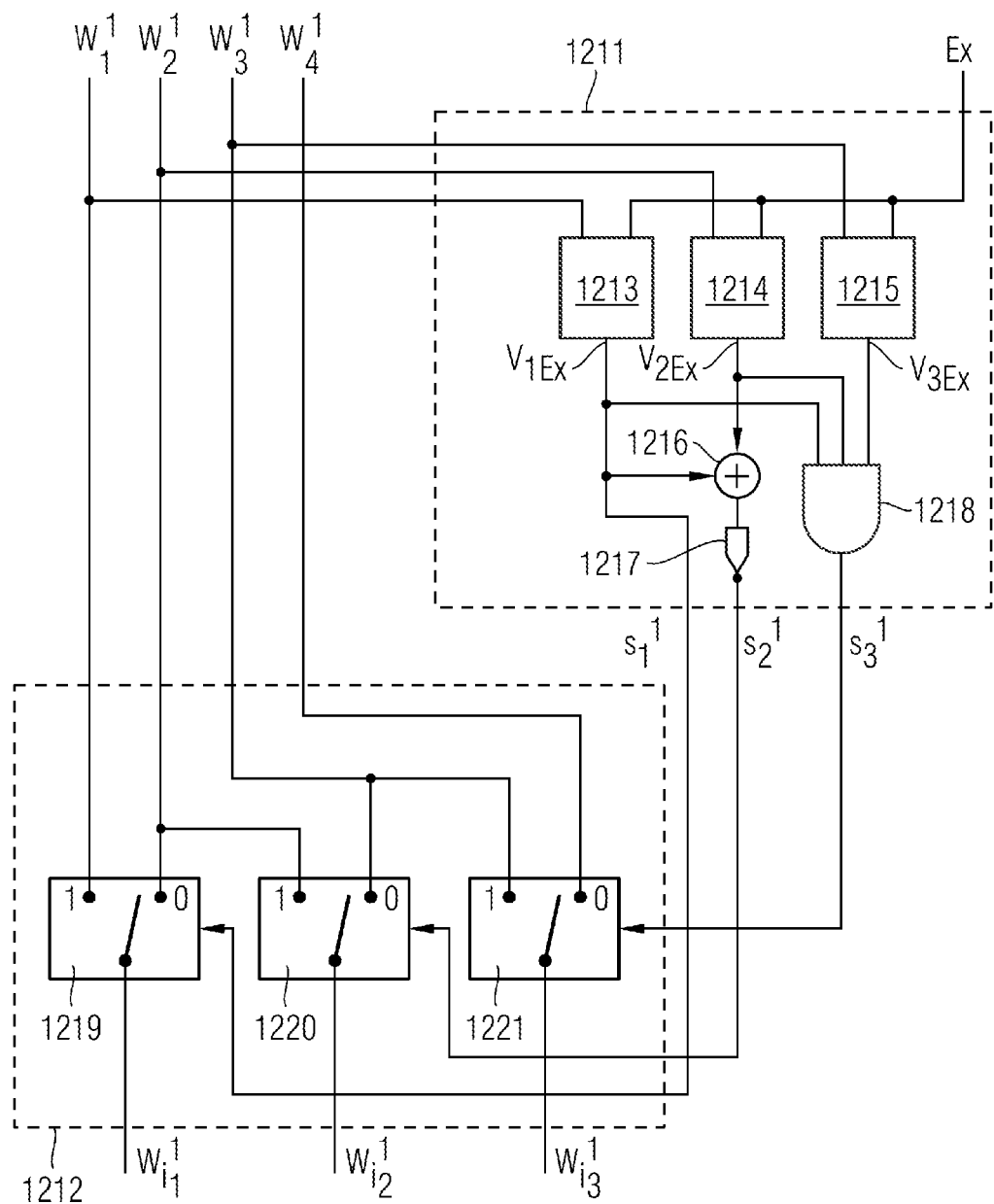
FIG. 12 shows a control circuit with an external signal and its interconnection with a selection circuit.

FIG. 12 shows an alternative embodiment of a control signal forming unit 1211 and of a selection circuit 1212. The half reference values $W_1^1$, $W_2^1$, $W_3^1$ and $W_4^1$ are fed to the selection circuit 1212 and the half reference values $W_1^1$, $W_2^1$ and $W_3^1$ are fed to the control signal forming unit 1211. Furthermore, an external signal Ex is fed to the control signal forming unit 1211. The control signal forming unit comprises three comparators 1213, 1214, 1215, an XOR gate 1216, an inverter 1217 and an AND gate 1218 having three inputs and an output. The control signal forming unit 1211 provides at its output (three lines) the binary components $s_1^1$, $s_2^1$, $s_3^1$ of the binary control signal $s^1$ for controlling the selection circuit 1212. The selection circuit 1212 comprises three multiplexers 1219, 1220 and 1221, each of which has two inputs, an output and a control input.

The first input of the comparator 1213 is connected to the half reference value $W_1^1$ and its second input is connected to the external signal Ex. The comparison signal $v_{1Ex}$ is provided at the output of the comparator 1213. The first input of the comparator 1214 is connected to the half reference value $W_2^1$ and its second input is connected to the external signal Ex. The comparison signal $v_{2Ex}$ is provided at the output of the comparator 1214. The first input of the comparator 1215 is connected to the half reference value $W_3^1$ and its second input is connected to the external signal Ex. The comparison signal $v_{3Ex}$ is provided at the output of the comparator 1215.

The binary comparison signal $v_{1Ex}$ is present at the output of the comparator 1213 in accordance with:
$v_{1Ex}=1$, if the following holds true: $W_1^1 \geq Ex$;
$v_{1Ex}=0$, if the following holds true: $W_1^1 < Ex$.
The binary comparison signal $v_{2Ex}$ is present at the output of the comparator 1214 in accordance with:
$v_{2Ex}=1$, if the following holds true: $W_2^1 \geq Ex$;
$v_{2Ex}=0$, if the following holds true: $W_2^1 < Ex$.
The binary comparison signal $v_{3Ex}$ is present at the output of the comparator 1215 in accordance with:
$v_{3Ex}=1$, if the following holds true: $W_3^1 \geq Ex$;
$v_{3Ex}=0$, if the following holds true: $W_3^1 < Ex$.

The comparison signals $v_{1Ex}$, $v_{2Ex}$ and $v_{3Ex}$ are respectively passed to one of the inputs of the AND gate 1218. The binary component $s_3^1$ is provided at the output of the AND gate 1218. The comparison signals $v_{1Ex}$ and $v_{2Ex}$ are logically combined by the XOR gate 1216 and provided as binary component $s_2^1$ via the inverter 1217. The binary component $s_1^1$ is provided by the comparison signal $V_{1Ex}$.

The half reference value $W_1^1$ is present at the 1-input of the multiplexer 1219, and the half reference value $W_2^1$ is present at the 0-input of the multiplexer 1219. The half reference value $W_2^1$ is present at the 1-input of the multiplexer 1220, and the half reference value $W_3^1$ is present at the 0-input of the multiplexer 1220. The half reference value $W_3^1$ is present at the 1-input of the multiplexer 1221, and the half reference value $W_4^1$ is present at the 0-input of the multiplexer 1221.

The binary component $s_1^1$ controls the multiplexer 1219, the binary component $s_2^1$ controls the multiplexer 1220 and the binary component $s_3^1$ controls the multiplexer 1221.

A half reference value $W_{i_1}^1$ is output at the output of the multiplexer 1219, a half reference value $W_{i_2}^1$ is output at the output of the multiplexer 1220 and a half reference value $W_{i_3}^1$ is output at the output of the multiplexer 1221.

In the example embodiment shown in FIG. 12, it should be assumed by way of example that the half reference values are 1-reference values and that the 1-reference values are greater than the values of the corresponding 0-reference values. The external signal Ex is chosen, in particular, in such a way that it is less than an error-free 1-reference value and is greater than an error-free 0-reference value.

The circuit arrangement from FIG. 12 is embodied such that if one of the half reference values $W_1^1$, $W_2^1$, $W_3^1$ and $W_4^1$ is erroneously less than the external signal Ex, the half reference values which are greater than or equal to the external signal Ex are output. The circuit arrangement is thus error-tolerant with respect to an erroneous half reference value.

If, for example, only the half reference value $W_4^1 < Ex$ and the other half reference values are greater than or equal to the external signal Ex, then it holds true that:

$v_{1Ex}=v_{2Ex}=v_{3Ex}=1$ $s_1^1=v_{1Ex}1$ $s_2^1=\overline{v_{1Ex} \oplus v_{2Ex}}=1$ $s_3^1=v_{1Ex} \wedge v_{2Ex} \wedge v_{3Ex}=1$.

Therefore, the multiplexers 1219, 1220 and 1221 in each case connect their 1-input to the output, such that it holds true that:

$W_{i_1}^1=W_1^1$, $W_{i_2}^1=W_2^1$ and $W_{i_3}^1=W_3^1$.

Therefore, the correct half reference values are output by the circuit arrangement in accordance with FIG. 12.

Although the disclosure has been more specifically illustrated and described in detail by means of the at least one example embodiment shown, nevertheless the disclosure is not restricted thereto and other variations can be derived therefrom by the person skilled in the art, without departing from the scope of protection of the disclosure.

The invention claimed is:

1. A method for determining a reference value on the basis of a plurality of half reference values stored in memory cells,
   wherein the plurality of half reference values are read from the memory cells,
   wherein a subset of read half reference values is determined from an evaluation of the plurality of read half reference values, wherein the subset of read half reference values comprises fewer than all of the half reference values,
   wherein the reference value is determined on the basis of the subset of half reference values.

2. The method as claimed in claim 1, wherein the subset of the half reference values is determined by at least one erroneous half reference value being excluded.

3. The method as claimed in claim 1, wherein the subset of the half reference values is determined by at least one half reference value being excluded which deviates from the other half reference values by at least one predefined value.

4. The method as claimed in claim 1,
   wherein the half reference values comprise a number of x groups of half reference values, wherein each memory cell can store x possible digital states, wherein x is an integer, and wherein $x \geq 2$;
   wherein each group comprises at least one half reference value,
   wherein the subset of half reference values is determined from the plurality of half reference values for each group, and
   wherein the reference value is determined on the basis of the plurality of group subset of the half reference values for each group.

5. The method as claimed in claim 4, wherein the group subset of the half reference values for each group is determined by at least one half reference value being excluded which deviates from the other half reference values of the group by a predefined value.

6. The method as claimed in claim 4, wherein x=2 holds true and each memory cell can store two digital states.

7. The method as claimed in claim 4, wherein the reference value is determined on the basis of at least one of the following operations:
- an averaging of the half reference values of at least one group,
- a formation of the median of the half reference values of at least one group,
- a weighted averaging of the half reference values of at least one group.

8. The method as claimed in claim 4, wherein the reference value is determined in a manner additionally taking account of an external signal for correcting the half reference values of at least one group.

9. The method as claimed in claim 4, wherein at least one group subset of half reference values is determined
- using a group-specific control signal forming unit to determine which of the half reference values of the group are intended to be taken into account for determining the reference value, and
- using a group-specific selection circuit to select the group subset of the half reference values by means of a control signal provided by the control signal forming unit.

10. The method as claimed in claim 9, wherein the reference value is determined by means of a reference value forming unit on the basis of at least one group subset of the half reference values.

11. A device for determining a reference value on the basis of a plurality of half reference values stored in memory cells, comprising:
- a processing unit configured to:
  - determine a subset of a plurality of half reference values read from the memory cells, wherein the subset comprises fewer than all of the half reference values, and
  - determine the reference value on the basis of the subset of the half reference values.

12. The device as claimed in claim 11, wherein the processing unit comprises at least one selection component with the aid of which the subset of half reference values is determinable, wherein the selection component comprises:
- a control signal forming unit, with the aid of which a control signal is generatable on the basis of comparisons of the half reference values or of a portion of the half reference values; and
- a selection circuit, with the aid of which a group-related subset of the half reference values is selectable on the basis of the control signal of the control signal forming unit.

13. The device as claimed in claim 12, wherein at least one selection component is provided for at least one group of half reference values, wherein each group of half reference values represents a multiplicity of half reference values which correspond to one of a plurality of digital states of the memory cell.

14. The device as claimed in claim 13, wherein each memory cell can assume two digital states, and wherein in each case at least one selection component is provided for a group of half reference values per digital state of the memory cell.

15. The device as claimed in claim 13, wherein the processing unit comprises a reference value forming unit, which determines the reference value by means of the at least one selection component.

16. The device as claimed in claim 15, wherein the reference value forming unit is designed in such a way that the reference value is determinable by means of at least one of the following operations:
- an averaging of the half reference values which are provided by the at least one selection component,
- a formation of the median of the half reference values which are provided by the at least one selection component,
- a weighted averaging of the half reference values which are provided by the at least one selection component.

17. The device as claimed in claim 15, wherein the reference value forming unit is configured in such a way that the reference value is determinable in a manner additionally taking account of an external signal for correcting the half reference values.

18. The device as claimed in claim 13, wherein a plurality of selection components are provided per group of half reference values.

19. A non-transitory computer program product loadable directly into a memory of a digital computer, comprising program code parts suitable for carrying out steps of the method, comprising:
- determining a reference value on the basis of a plurality of half reference values stored in memory cells,
- wherein the plurality of half reference values are read from the memory cells,
- wherein a subset of read half reference values is determined from an evaluation of the plurality of half reference values, wherein the subset of read half reference values comprises fewer than all of the half reference values,
- wherein the reference value is determined on the basis of the subset of half reference values.

20. A non-transitory computer-readable memory medium comprising instructions which are executable by a computer and which are suitable for the computer to carry out the method, comprising:
- determining a reference value on the basis of a plurality of half reference values stored in memory cells,
- wherein the plurality of read half reference values are read from the memory cells,
- wherein a subset of read half reference values is determined from an evaluation of the plurality of half reference values, wherein the subset of read half reference values comprises fewer than all of the half reference values,
- wherein the reference value is determined on the basis of the subset of half reference values.

* * * * *